United States Patent
Yu et al.

(10) Patent No.: US 10,157,871 B1
(45) Date of Patent: Dec. 18, 2018

(54) INTEGRATED FAN-OUT PACKAGE AND MANUFACTURING METHOD THEREOF

(71) Applicant: Taiwan Semiconductor Manufacturing Co., Ltd., Hsinchu (TW)

(72) Inventors: Chi-Yang Yu, Taoyuan (TW); Chin-Liang Chen, Kaohsiung (TW); Hai-Ming Chen, Kaohsiung (TW); Kuan-Lin Ho, Hsinchu (TW); Yu-Min Liang, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/730,760

(22) Filed: Oct. 12, 2017

(51) Int. Cl.
| | |
|---|---|
| *H01L 23/31* | (2006.01) |
| *H01L 23/00* | (2006.01) |
| *H01L 21/768* | (2006.01) |
| *H01L 21/56* | (2006.01) |

(Continued)

(52) U.S. Cl.
CPC ............ *H01L 24/11* (2013.01); *H01L 21/563* (2013.01); *H01L 21/568* (2013.01); *H01L 21/76802* (2013.01); *H01L 21/76843* (2013.01); *H01L 21/76871* (2013.01); *H01L 23/3114* (2013.01); *H01L 23/5226* (2013.01); *H01L 23/53238* (2013.01); *H01L 24/04* (2013.01); *H01L 24/09* (2013.01); *H01L 24/14* (2013.01); *H01L 24/20* (2013.01); *H01L 2224/02331* (2013.01);

(Continued)

(58) Field of Classification Search
CPC . H01L 2924/351; H01L 23/562; H01L 23/52; H01L 23/522; H01L 23/532; H01L 23/53295; H01L 2224/1308–2224/13084; H01L 24/11; H01L 24/20; H01L 24/04; H01L 24/09; H01L 21/76802; H01L 21/76843; H01L 24/14; H01L 21/76871; H01L 23/53238
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Selim Ahmed
*Assistant Examiner* — Evan Clinton
(74) *Attorney, Agent, or Firm* — JCIPRNET

(57) ABSTRACT

An integrated fan-out package includes a die, an encapsulant, a redistribution structure, a plurality of conductive pillars, a seed layer, and a plurality of conductive bumps. The encapsulant encapsulates the die. The redistribution structure is over the die and the encapsulant. The redistribution structure is electrically connected to the die and includes a plurality of dielectric layers that are sequentially stacked and a plurality of conductive patterns sandwiched between the dielectric layers. A Young's modulus of the dielectric layer farthest away from the die is higher than a Young's modulus of each of the rest of the dielectric layers. The conductive patterns are electrically connected to each other. The conductive pillars are disposed on and electrically connected to the redistribution structure. The seed layer is located between the conductive pillars and the redistribution structure. The conductive bumps are disposed on the plurality of conductive pillars.

20 Claims, 32 Drawing Sheets

(51) Int. Cl.
*H01L 23/522* (2006.01)
*H01L 23/532* (2006.01)

(52) U.S. Cl.
CPC .............. *H01L 2924/15174* (2013.01); *H01L 2924/3511* (2013.01); *H01L 2924/35121* (2013.01)

(56) References Cited

U.S. PATENT DOCUMENTS

| | | |
|---|---|---|
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2017/0040270 A1* | 2/2017 | Uzoh ................... H01L 24/03 |
| 2017/0077079 A1* | 3/2017 | Lan ..................... H01L 27/01 |
| 2017/0294412 A1* | 10/2017 | Lee ................... H01L 23/5384 |
| 2017/0365566 A1* | 12/2017 | Lee ..................... H01L 24/02 |

* cited by examiner

INTEGRATED FAN-OUT PACKAGE AND MANUFACTURING METHOD THEREOF

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. Currently, integrated fan-out packages are becoming increasingly popular for their compactness. The integrated fan-out packages typically include a redistribution circuit structure laying over the molded integrated circuit devices such that the integrated circuit devices may be accessed. In order to meet the requirements for smaller sizes and higher packing densities, the manufacturing method for the redistribution circuit structure has become an important issue in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3J are schematic enlarged cross-sectional views illustrating processes of a manufacturing method for an exemplary package focused in a region R in accordance with some alternative embodiments of the disclosure.

DETAILED DESCRIPTION

Figure 1A:
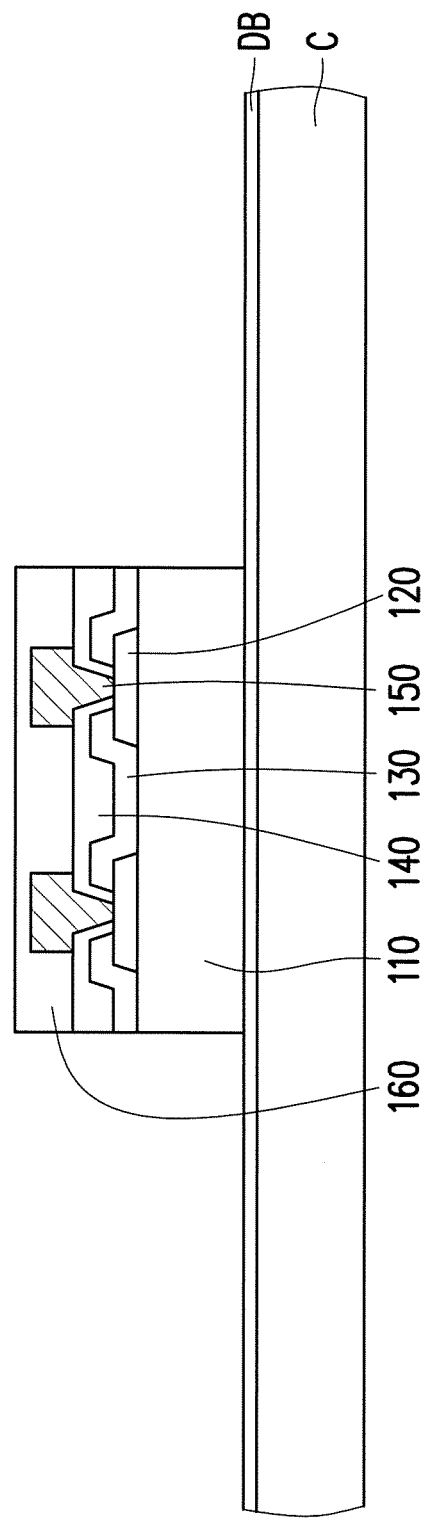
FIGS. 1A-1F are schematic cross-sectional views illustrating processes of a method for manufacturing an integrated fan-out package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1F are schematic cross-sectional views illustrating processes of a method for manufacturing an integrated fan-out package 10 in accordance with some embodiments of the disclosure. Referring to FIG. 1A, a carrier substrate C having a de-bonding layer DB formed thereon is provided. In some embodiments, the carrier substrate C may be a glass substrate and the de-bonding layer DB may be a light-to-heat conversion (LTHC) release layer formed on the glass substrate. In some embodiments, a dielectric layer (not shown) may be optionally formed over the de-bonding layer DB.

As shown in FIG. 1A, a plurality of dies 100 is provided and placed over the carrier substrate C. In some embodiments, the dies 100 may be placed on the de-bonding layer DB through a pick and place process. The dies 100 may be attached or adhered on the de-bonding layer DB through a die attach film (DAF), an adhesion paste or the like. For simplicity, only one die 100 is illustrated in FIG. 1A. However, more than one dies are provided and may be arranged in an array. It is understood that the scope of the disclosure is not limited by the disclosed example(s). In some embodiments, the current process step may be considered as part of a wafer level packaging process.

In some embodiments, as illustrated in FIG. 1A, each die 100 includes a semiconductor substrate 110, a plurality of conductive pads 120, a passivation layer 130, a post-passivation layer 140, a plurality of conductive posts 150, and a protection layer 160. In some embodiments, the semiconductor substrate 110 may be a silicon substrate including active components (e.g., transistors or the like) and optionally passive components (e.g., resistors, capacitors, inductors or the like) formed therein. The conductive pads 120 are formed on the semiconductor substrate 110 and may be aluminum pads, copper pads or other suitable metal pads. The conductive posts 150 are disposed on the conductive pads 120 and are electrically connected to the conductive pads 120. In some embodiments, the conductive posts 150 are formed on the conductive pads 120 by a plating process of a conductive material. In some embodiments, the conductive posts 150 are plated copper pillars or other suitable metallic pillars. In some alternative embodiments, the conductive posts 150 are copper pillars or other suitable metallic pillars which are covered by solder caps (e.g., lead-free solder caps). In some embodiments, the protection layer 160 may be a polymer layer having sufficient thickness to encapsulate and protect the conductive posts 150. In some embodiments, the material of the protection layer 160 includes polybenzoxazole (PBO), polyimide (PI), or other suitable polymeric material. In some alternative embodiments, the protection layer 160 may be made of inorganic materials. In some embodiments, the post-passivation layer 140 is optional.

Figure 1B:
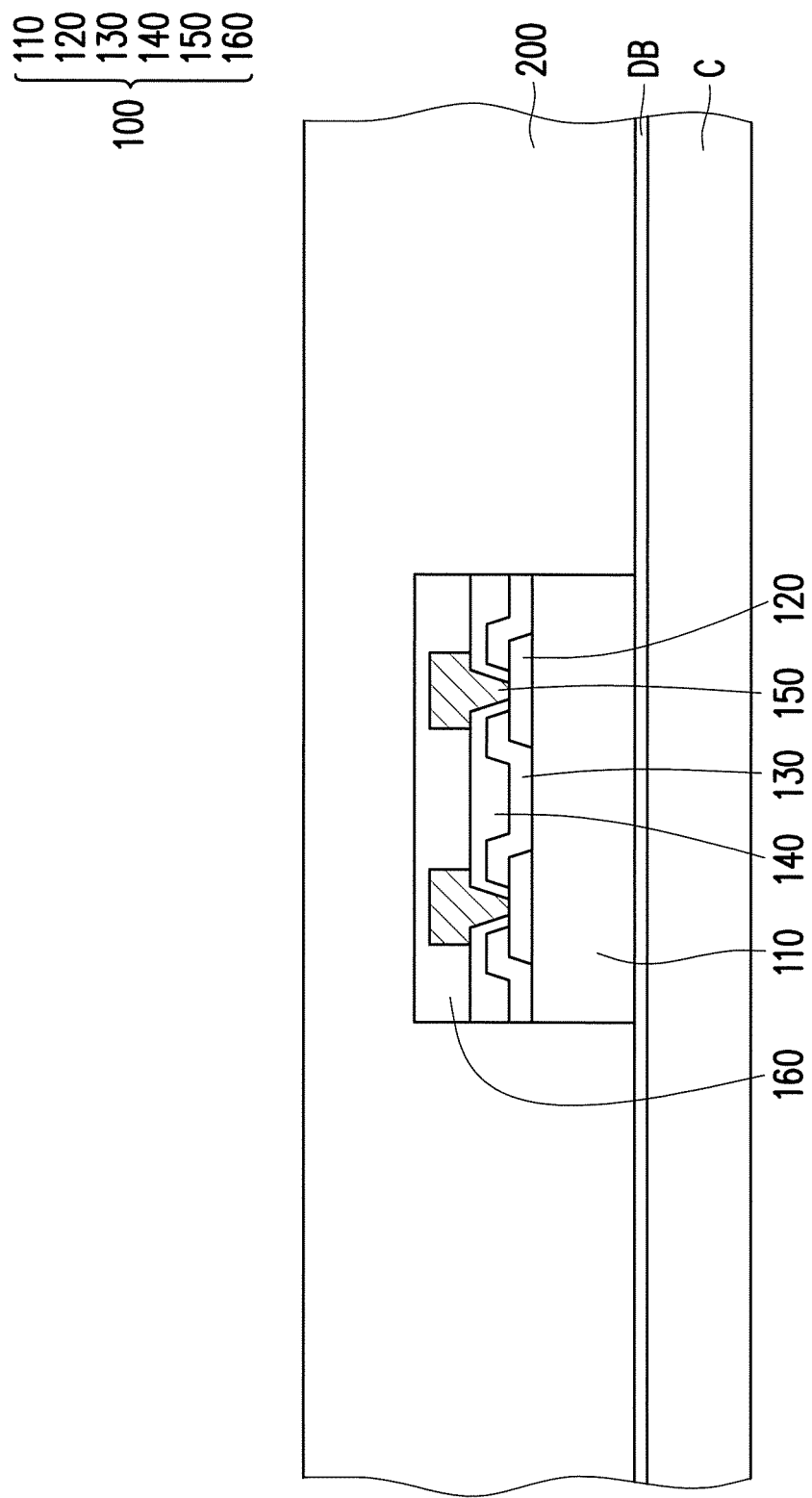

Referring to FIG. 1B, an encapsulation material 200 is formed on the de-bonding layer DB to encapsulate the die(s) 100. In other words, all of the dies 100 (only one die is shown in FIG. 1B) are molded and embedded in the encapsulation material 200. In some embodiments, the encapsulation material 200 is formed by a molding process. The conductive posts 150 and the protection layer 160 of the die 100 are fully covered by the encapsulation material 200. In other words, the conductive posts 150 and the protection layer 160 of the die 100 are not revealed and are well protected by the encapsulation material 200. In some alternative embodiments, the material of the encapsulation material 200 includes an epoxy resin or other suitable dielectric materials.

Figure 1C:
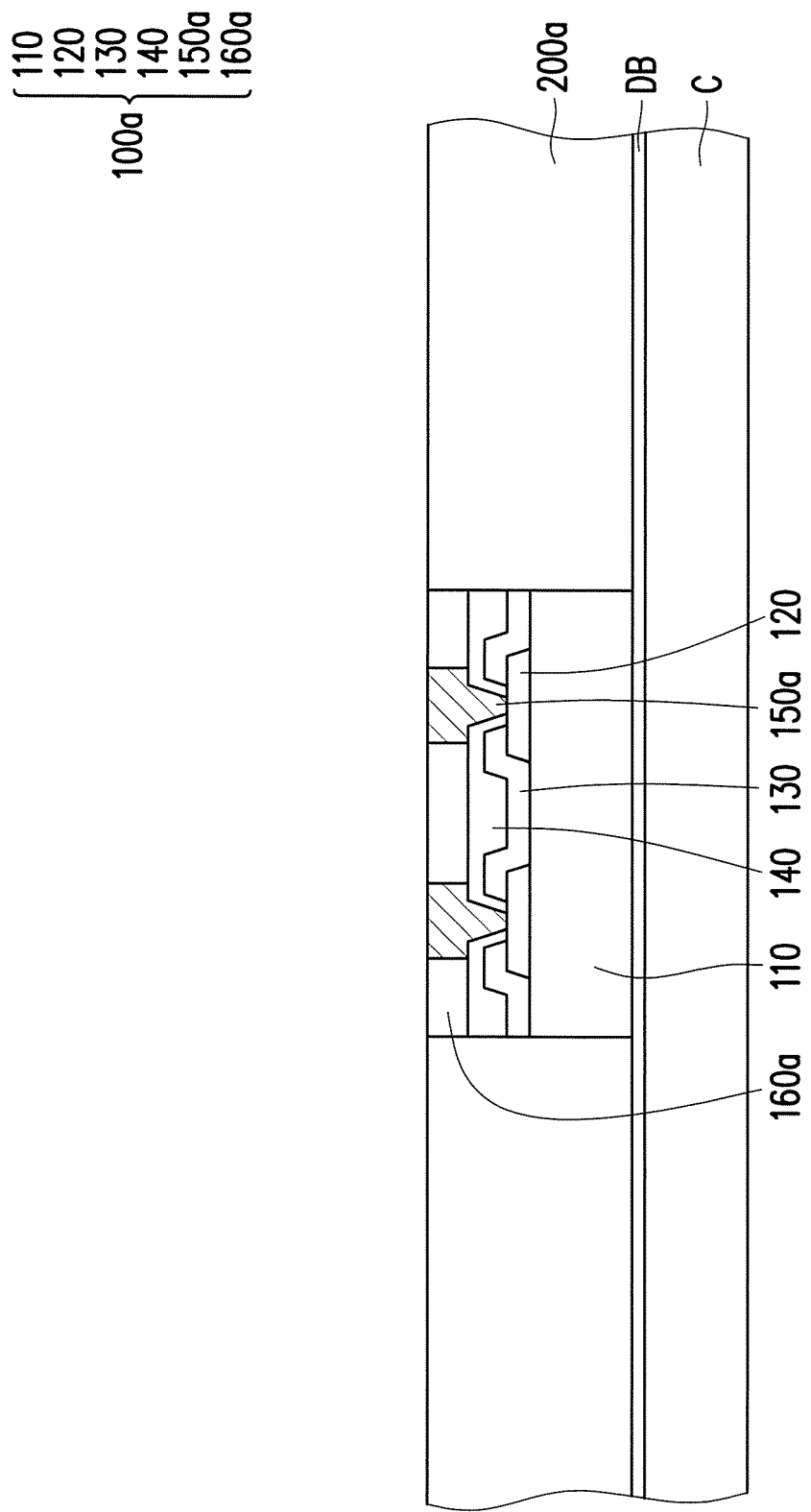

Referring to FIG. 1C, the encapsulation material 200 is then ground until the conductive posts 150 are exposed to form an encapsulant 200a. In some embodiments, the encapsulation material 200 is ground by a mechanical grinding process and/or a chemical mechanical polishing (CMP) process. During the grinding process of the encapsulation material 200, portions of the protection layer 160 and portions of the conductive pillars 150 are ground to form a protection layer 160a and conductive posts 150a. As illustrated in FIG. 1C, the encapsulant 200a surrounds the die(s) 100a and laterally encapsulates sidewalls of the die(s) 100a. In other words, sidewalls of the dies 100a (only one die is shown in FIG. 1C) are surrounded and wrapped by the encapsulant 200a. In some embodiments, top surface of the encapsulant 200a, top surfaces of the conductive posts 150a, and top surface of the protection layer 160a are substantially coplanar and flush with one another.

Figure 1D:
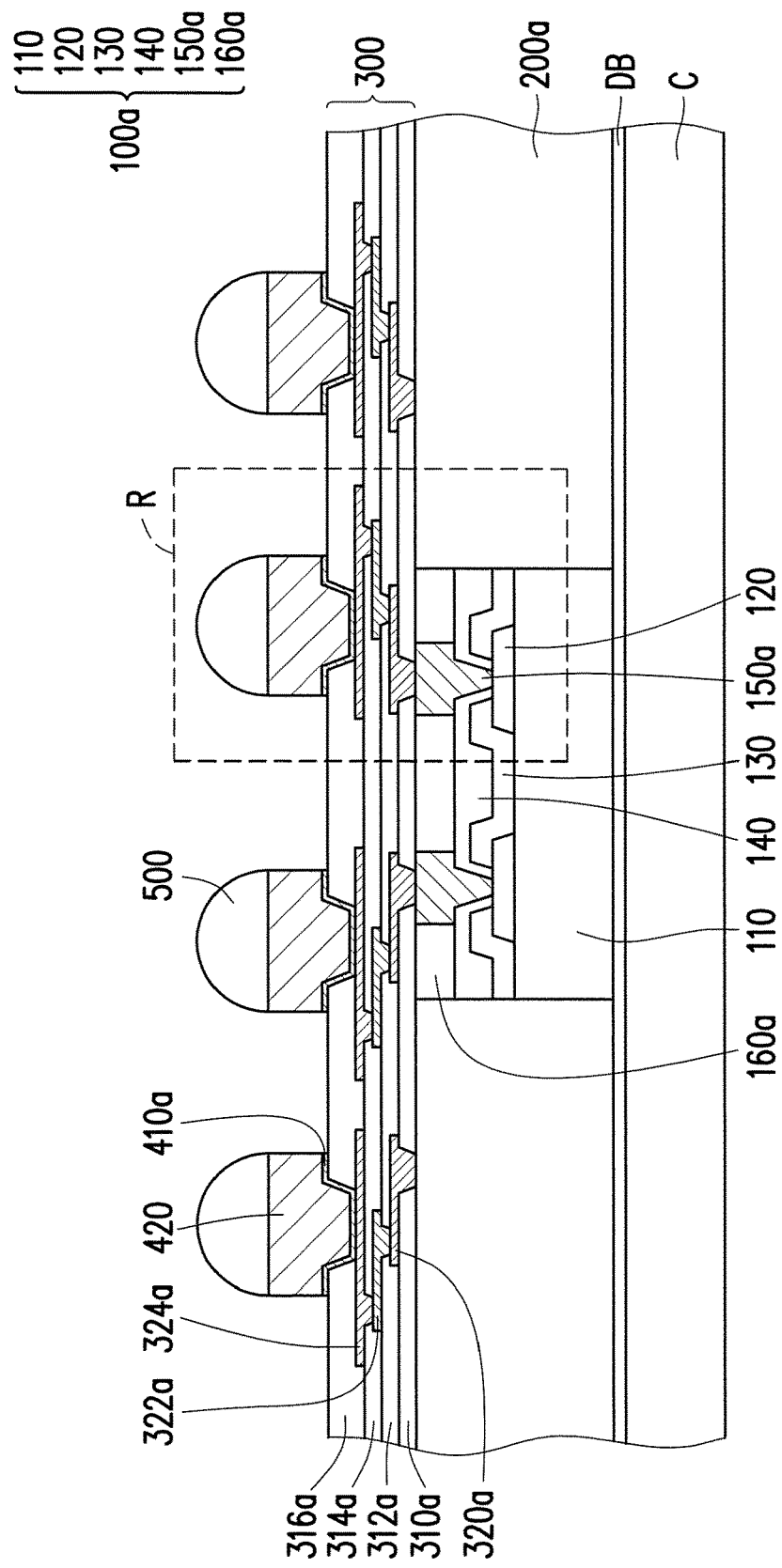

Referring to FIG. 1D, a redistribution structure 300 is formed over the encapsulant 200a and covering the die(s) 100a. In some embodiments, a seed layer 410a and a plurality of conductive pillars 420 are later formed on the redistribution structure 300. Thereafter, a plurality of conductive bumps 500 are formed over the conductive pillars 420. In some embodiments, the conductive pillars 420 and the conductive bumps 500 are collectively referred to as controlled collapse chip connect (C4) bumps. In FIG. 1D, a region R is encircled by the dotted line and such region R will be further illustrated to describe the connection between the redistribution structure 300, the conductive pillars 420, and the conductive bumps 500. Such region R may be shown in schematic enlarged views to further describe the manufacturing processes and possible structural alternations in the following paragraphs. In some embodiments, the redistribution structure 300 includes a first dielectric layer 310a, a second dielectric layer 312a, a third dielectric layer 314a, and a fourth dielectric layer 316a stacked in sequence. In some embodiments, the redistribution structure 300 also includes a plurality of first conductive patterns 320a, a plurality of second conductive patterns 322a, and a plurality of third conductive patterns 324a electrically connected to one another. The first conductive patterns 320a are sandwiched between the first dielectric layer 310a and the second dielectric layer 312a. Similarly, the second conductive patterns 322a and the third conductive patterns 324a are respectively sandwiched between the second dielectric layer 312a and the third dielectric layer 314a and between the third dielectric layer 314a and the fourth dielectric layer 316a. In some embodiments, the redistribution structure 300 is electrically connected to the dies 100a. For example, the first conductive patterns 320a may be in contact with the conductive posts 150a of the die 100a to render electrical connection between the two. In some embodiments, for the redistribution structure having four dielectric layers, the fourth dielectric layer 316a is referred to as the dielectric layer farthest away from the dies 100a in a direction perpendicular to top surfaces 111 of the dies 100a (only one die is shown in FIG. 1D). In certain embodiments, the dielectric layer farthest away from the die 100a or the dielectric layer receiving the conductive pillars 420 has a Young's modulus (modulus of elasticity) higher than the other dielectric layers of the redistribution structure 300. Similarly, the third conductive patterns 324a are referred to as the conductive patterns farthest away from the dies 100a in the direction perpendicular to top surfaces 111 of the dies 100a. In some embodiments, the Young's modulus of the fourth dielectric layer 316a is higher than the Young's modulus of the first dielectric layer 310a, the second dielectric layer 312a, and the third dielectric layer 314a. In some embodiments, a Young's modulus of the fourth dielectric layer 316a ranges between 0.5 GPa and 150 GPa. On the other hand, Young's modulus of the first dielectric layer 310a, the second dielectric layer 312a, and the third dielectric layer 314a range between 0.1 GPa and 100 GPa. In certain embodiments, the ratio of the Young's modulus of the fourth dielectric layer 316a to the Young's modulus of the first, second, or third dielectric layer 310a, 312a, 314a ranges from 1.05 to 100. When the ratio of the Young's modulus is below 1.05, the fourth dielectric layer 316a is not able to endure the stress generated from the conductive pillars 420, thereby causing the conductive patterns in the redistribution structure 300 to deform. On the other hand, when the ratio of the Young's modulus is above 100, the fourth dielectric layer 316a would exhibit a hardness similar to that of pure silicon, thereby increasing the processing difficulty. In some embodiments, the thickness of the fourth dielectric layer 316a is larger than the thickness of the first dielectric layer 310a, the second dielectric layer 312a, or the third dielectric layer 314a. In some embodiments, due to the higher Young's modulus, the fourth dielectric layer 316a is able to alleviate or block the stress from the conductive pillars 420 to the underlying redistribution structure 300, thus protecting the conductive patterns in the redistribution structure 300 from being damaged by stress generated during assembly processes and/or thermal processes. In other words, the fourth dielectric layer 316a with a higher Young's modulus aids to alleviate the problem of fine line deformation in the redistribution structure 300. Therefore, in some embodiments, the fourth dielectric layer 316a of the redistribution structure 300 may be referred to as an anti-stress layer. It should be noted that although FIG. 1D depicted four dielectric layers and three conductive pattern layers, this configuration merely serve as an example. In some alternative embodiments, the redistribution structure 300 may include more or less layers of dielectric layer and conductive pattern layers.

As illustrated in FIG. 1D, in some embodiments, the seed layer 410a is formed before forming the conductive pillars 420 and is sandwiched between the conductive pillars 420 and the redistribution structure 300. In some embodiments, the conductive pillars 420 are electrically connected to the redistribution structure 300. For example, the conductive pillars 420 may be electrically connected to the third conductive patterns 324a. The descriptions with respect to the formation of the redistribution circuit structure 300, the seed layer 410a, the conductive pillars 420, and the conductive bumps 500 will be discussed in greater detail later in conjunction with FIGS. 2A-2K, 3A-3J, 4A-4J, 5A, 6A-6I, and 7A.

Figure 1E:
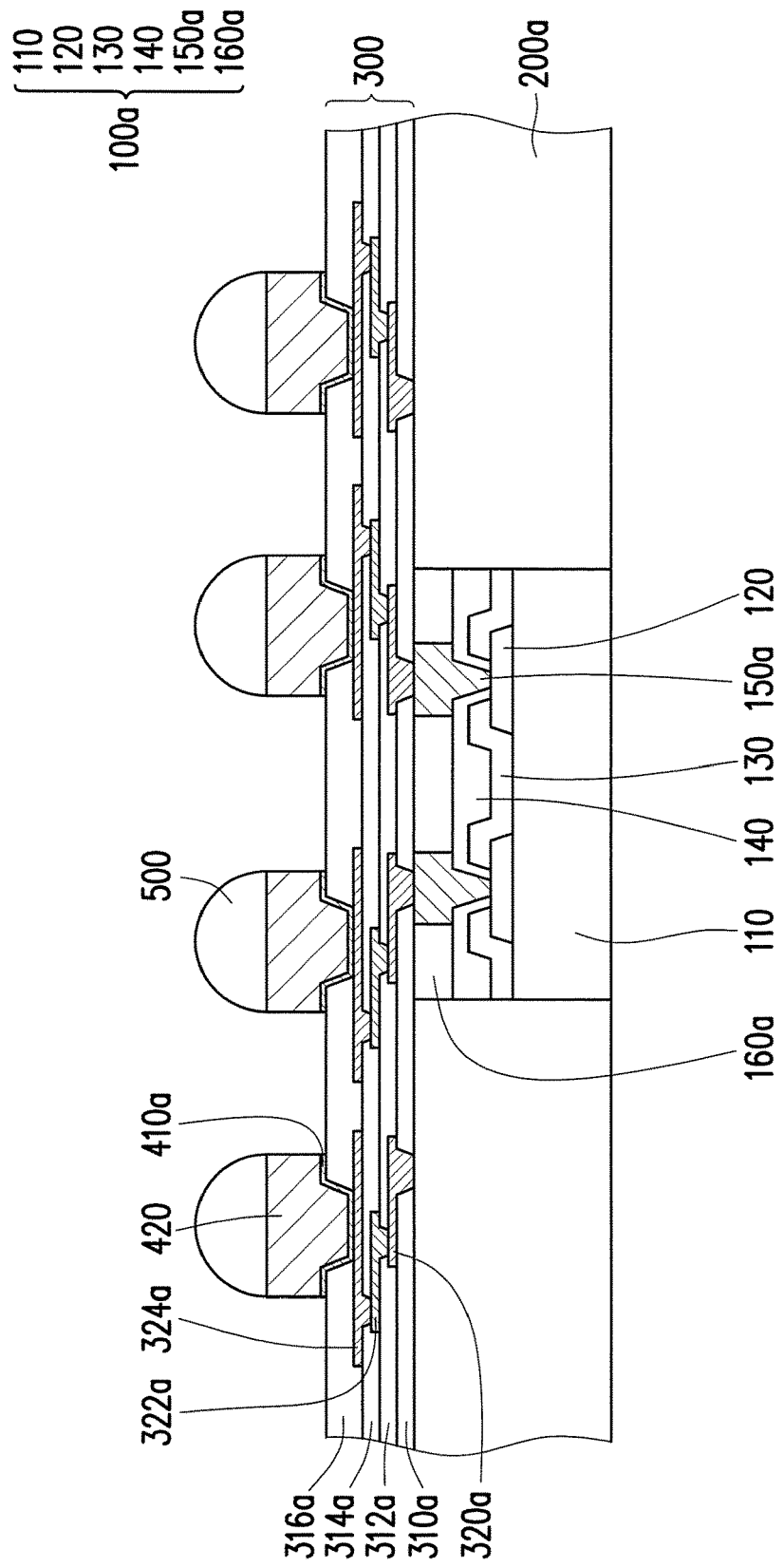
Figure 1F:
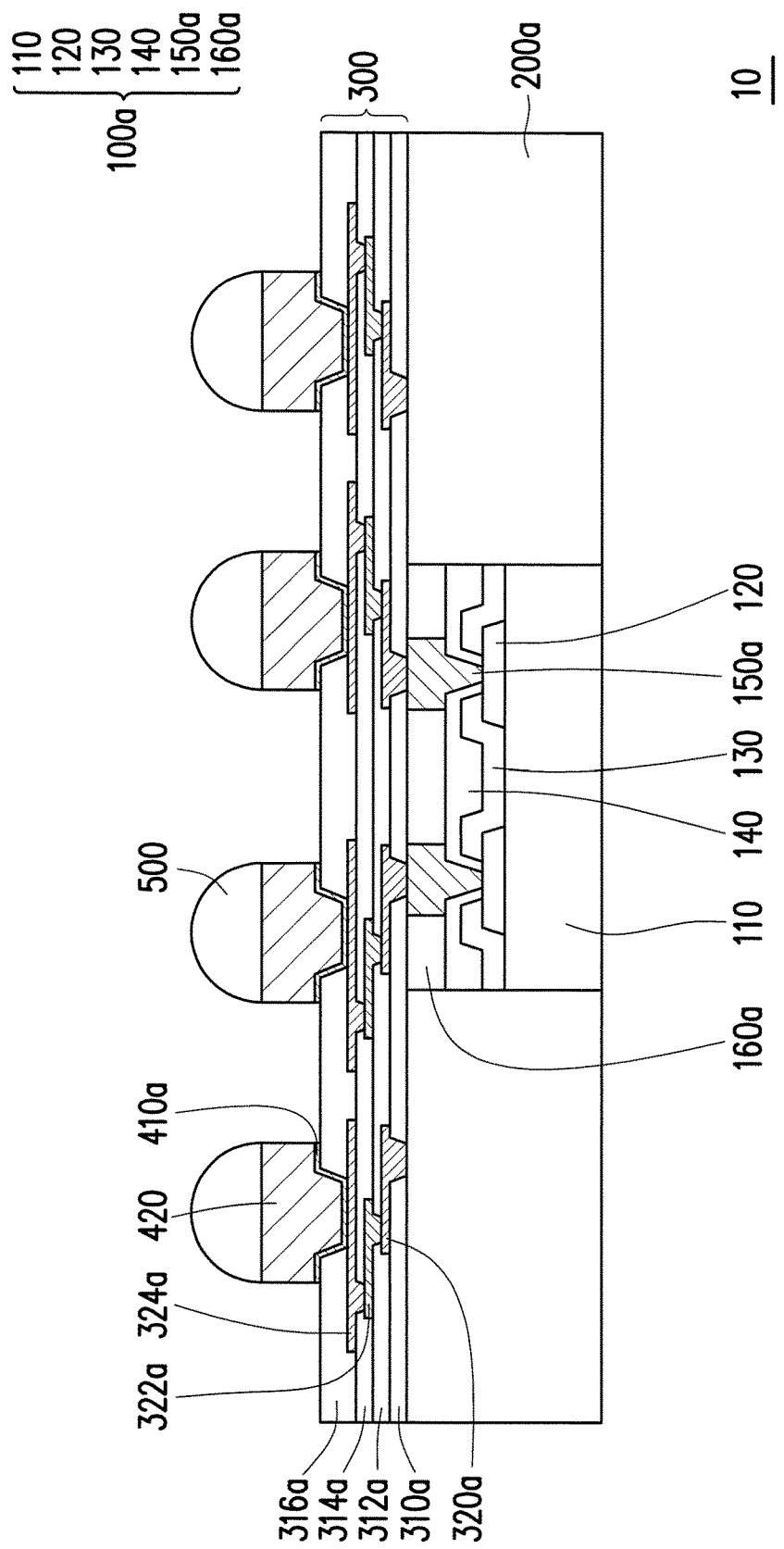

Referring to FIG. 1E, the integrated fan-out package array including the conductive bumps 500, the conductive pillars 420, the redistribution structure 300, the encapsulant 200a and the dies 100a (only one die is shown in FIG. 1F) is de-bonded from the de-bonding layer DB such that the dies 100a and the encapsulant 200a are separated from the carrier substrate C. In some embodiments, the de-bonding layer DB (e.g., the LTHC release layer) may be irradiated by an UV laser such that the de-bonding layer DB may be peeled off from the dies 100a and the encapsulant 200a to obtain an integrated fan-out package array.

Referring to FIG. 1F, the integrated fan-out package array is diced or singulated to form a plurality of integrated fan-out packages 10. In some embodiments, the dicing process or the singulation process typically involves dicing with a rotating blade or a laser beam. In other words, the dicing or singulation process is, for example, a laser cutting process, a mechanical cutting process, or other suitable processes.

Figure 2A:
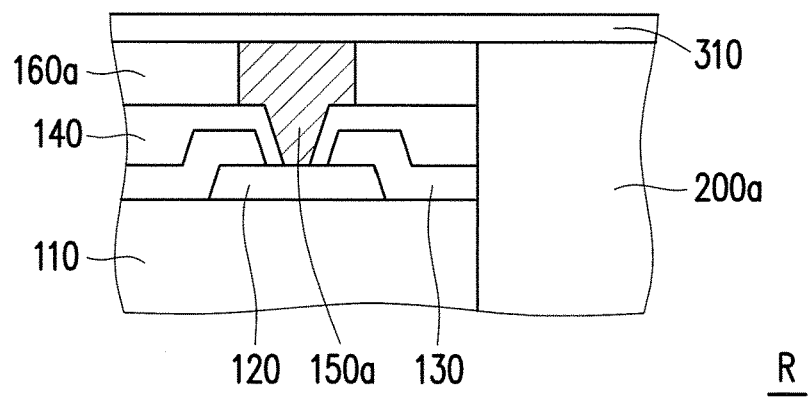
FIGS. 2A-2K are schematic enlarged cross-sectional views illustrating processes of a manufacturing method for an exemplary package focused in a region R in accordance with some embodiments of the disclosure.

FIGS. 2A-2K are schematic enlarged cross-sectional views illustrating processes of a manufacturing method for an exemplary package focused in a region R in accordance with some embodiments of the disclosure. FIGS. 2A-2K illustrated detailed process steps for forming the redistribution structure 300, the conductive pillars 420, and the conductive bumps 500 on the encapsulant 200a and dies 100a similar to the structures depicted in FIGS. 1C-1D. Referring to FIG. 2A, a dielectric material layer 310 is formed over the protection layer 160a, the conductive posts 150a, and the encapsulant 200a. In some embodiments, the material of the dielectric material layer 310 includes polyimide, epoxy resin, acrylic resin, phenol resin, benzocyclobutene (BCB), polybenzooxazole (PBO), or any other suitable polymer-based dielectric material. In some embodiments, the dielectric material layer 310 has a Young's modulus ranges between 0.1 GPa and 100 GPa and has a thickness ranges between 1 µm to 50 µm. The dielectric material layer 310, for example, may be formed by suitable fabrication techniques such as spin-on coating, chemical vapor deposition (CVD), plasma-enhanced chemical vapor deposition (PECVD) or the like.

Figure 2B:
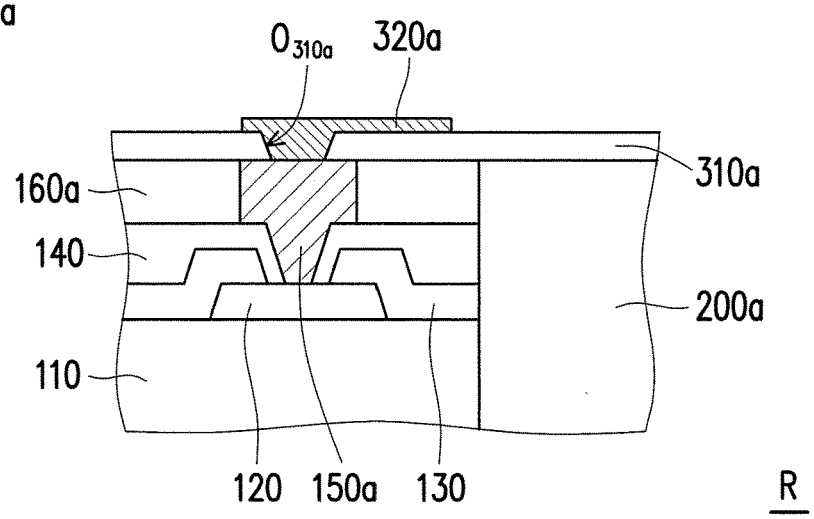

Referring to FIG. 2B, in some embodiments, the dielectric material layer 310 is patterned to form the first dielectric layer 310a having a plurality of openings $O_{310a}$. In some embodiments, the openings $O_{310a}$ expose the conductive posts 150a located underneath the first dielectric layer 310a. The dielectric material layer 310 may be patterned through a photolithography process and an etching process. Thereafter, the first conductive patterns 320a are formed over the first dielectric layer 310a. In some embodiments, the first conductive patterns 320a extends into the openings $O_{310a}$ to be in contact with the conductive posts 150a. The first conductive patterns 320a may be formed by, for example, electroplating, deposition, and/or photolithography and etching. In some embodiments, a material of the first conductive patterns 320a includes aluminum, titanium, copper, nickel, tungsten, and/or alloys thereof.

Figure 2C:
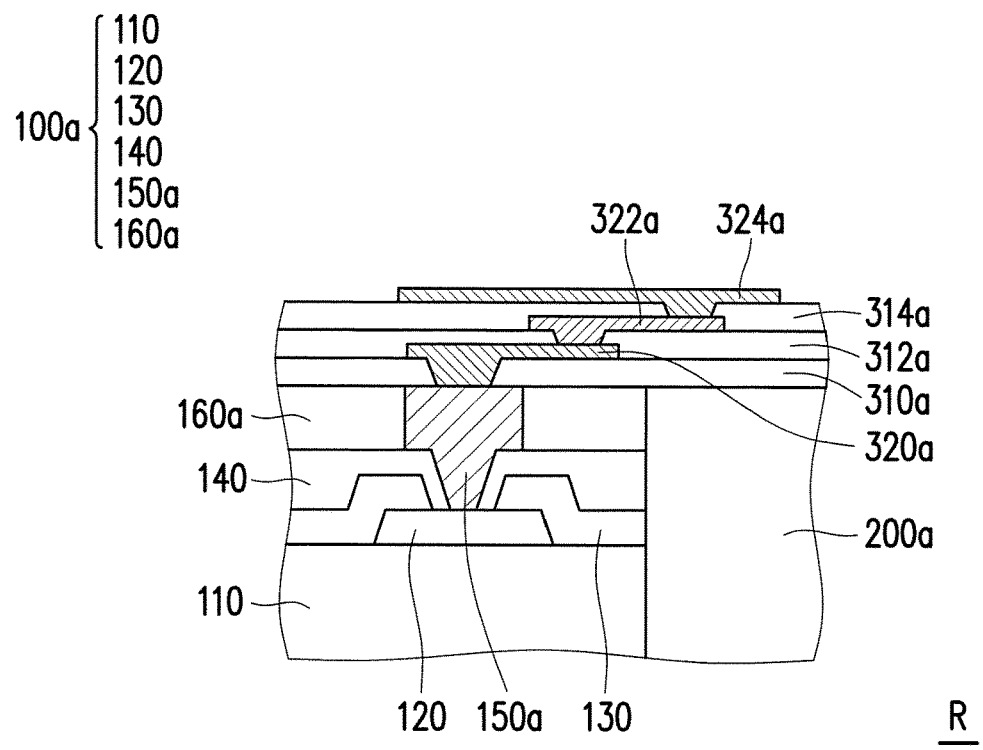

Referring to FIG. 2C, the process steps described in the contexts related to FIG. 2B are repeated to sequentially form the second dielectric layer 312a, the second conductive patterns 322a, the third dielectric layer 314a, and the third conductive patterns 324a. In some embodiments, the materials of the first dielectric layer 310a, the second dielectric layer 312a, and the third dielectric layer 314a may be the same. In some embodiments, the materials of the first dielectric layer 310a, the second dielectric layer 312a, and the third dielectric layer 314a may be different, as long as the Young's modulus thereof fall in the range of 0.1 GPa to 100 GPa. Similarly, the materials of the first conductive patterns 320a, the second conductive patterns 322a, and the third conductive patterns 324a may be the same or different.

Figure 2D:
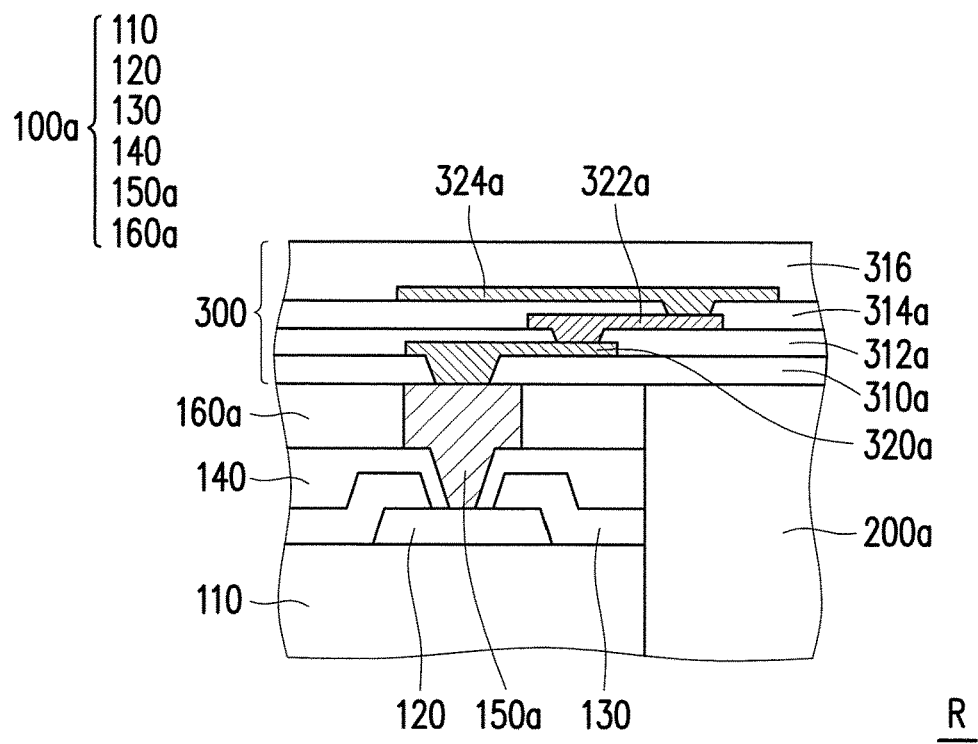
Figure 2E:
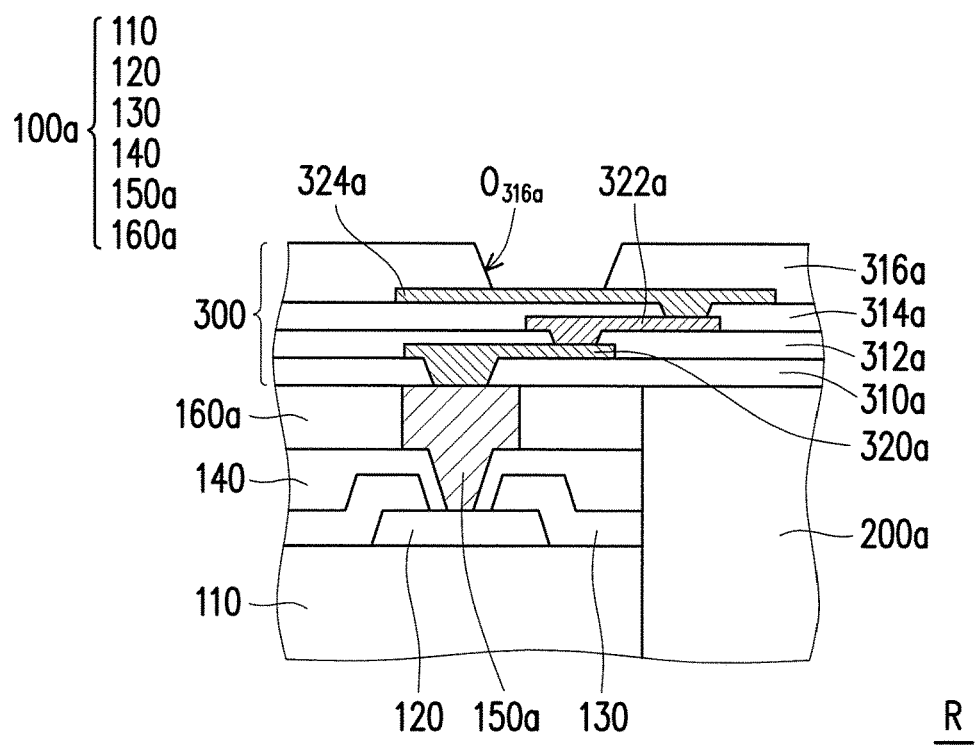

Referring to FIG. 2D and FIG. 2E, the fourth dielectric layer 316a is formed over the third dielectric layer 314a and the third conductive patterns 324a. In some embodiments, the fourth dielectric layer 316a may be formed by first forming a dielectric material layer 316 over the third dielectric layer 314a and the third conductive patterns 324a. Subsequently, the dielectric material layer 316 is patterned to form the fourth dielectric layer 316a having a plurality of openings $O_{316a}$. The openings $O_{316a}$ expose the third conductive patterns 324a located underneath the fourth dielectric layer 316a. In some embodiments, the dielectric material layer 316 may be patterned through a photolithography process and an etching process. In some embodiments, a material of the fourth dielectric layer 316a is different from the materials of the first dielectric layer 310a, the second dielectric layer 312a, and the third dielectric layer 314a. For example, the material of the fourth dielectric layer 316a may include molding compound materials such as epoxy resins or phenolic resins. In some embodiments, the fourth dielectric layer 316a may further include fillers. In some embodiments, the material of the fourth dielectric layer 316a may include polyimide, epoxy resin, acrylic resin, phenol resin, benzocyclobutene (BCB), polybenzooxazole (PBO), or any other suitable polymer-based dielectric material. In some embodiments, the fourth dielectric layer 316a has a Young's modulus higher than the Young's modulus of the first dielectric layer 310a, the second dielectric layer 312a, and the third dielectric layer 314a. For example, the fourth dielectric layer 316a may have a Young's modulus ranges between 0.5 GPa and 150 GPa.

Figure 2F:
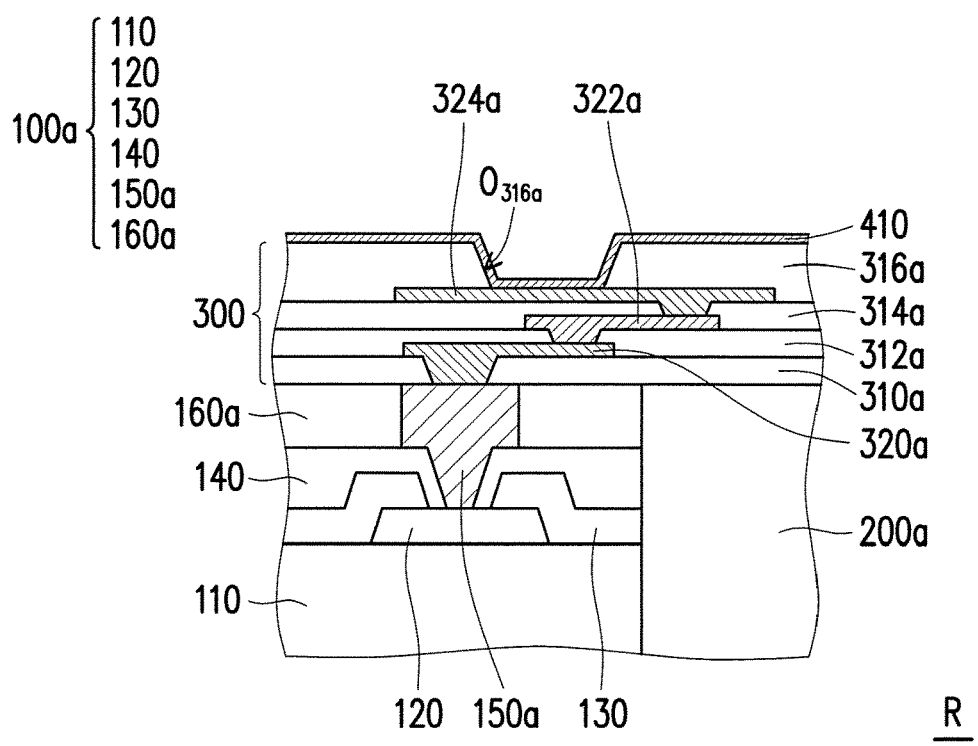

Referring to FIG. 2F, in some embodiments, a seed layer 410 is formed covering the openings $O_{316a}$ and over the fourth dielectric layer 316a. As illustrated in FIG. 2F, the seed layer 410 is formed in a conformal manner covering the profile of the openings $O_{316a}$. That is, the seed layer 410 extends into the openings $O_{316a}$ to cover a bottom surface and sidewalls of the openings $O_{316a}$. The seed layer 410 may be formed through, for example, a sputtering process, a physical vapor deposition (PVD) process, or the like. In some embodiments, the seed layer 410 may include, for example, copper, titanium-copper alloy, or other suitable choice of materials.

Figure 2G:
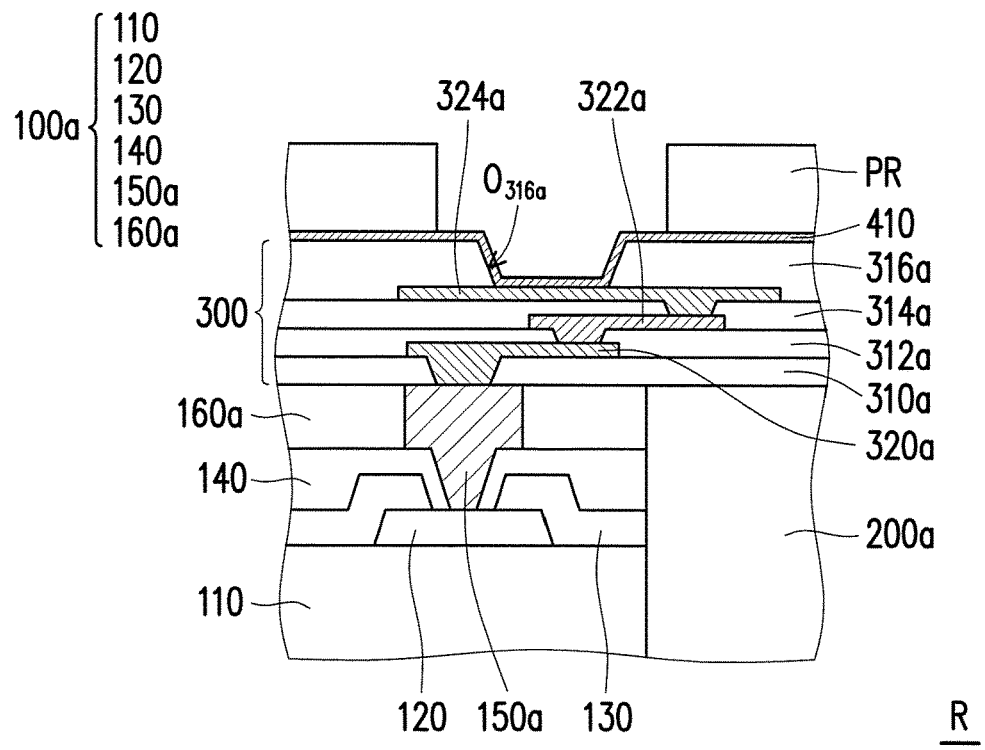

Referring to FIG. 2G, a photoresist pattern layer PR is formed over the seed layer 410. In some embodiments, the photoresist pattern layer PR exposes the seed layer 410 located in the openings $O_{316a}$ and exposes at least a portion of the seed layer 410 located on the fourth dielectric layer 316a and around the openings $O_{316a}$.

Figure 2H:
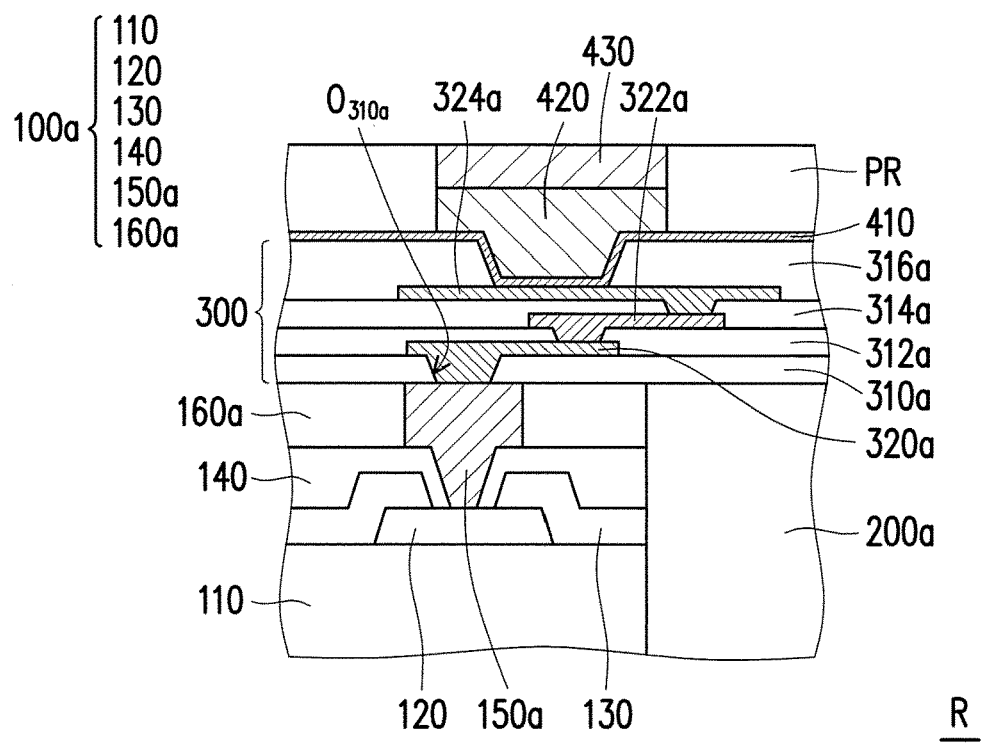

Referring to FIG. 2H, in some embodiments, conductive pillars 420 are formed on the seed layer 410 within the openings $O_{316a}$. In some embodiments, a conductive material (not shown) is deposited onto the exposed seed layer 410 to form the conductive pillars 420. Subsequently, a solder material 430 is deposited onto the conductive pillars 420. The conductive pillars 420 and the solder material 430 are located within openings of the photoresist pattern layer PR. In other words, the conductive pillars 420 and the solder material 430 are formed using the photoresist pattern layer PR as a mask. In some embodiments, the conductive material and the solder material 430 may be formed by a plating process. The plating process is, for example, electro-plating, electroless-plating, immersion plating, or the like. In some embodiments, the conductive material includes, for example, copper, copper alloys, or the like.

Figure 2I:
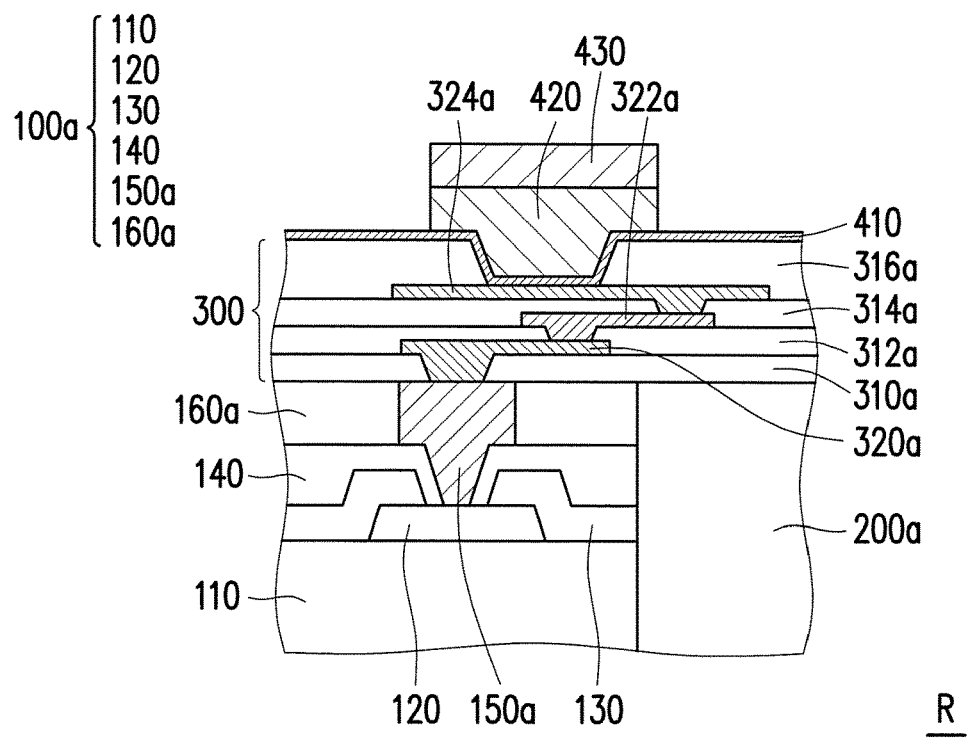

Referring to FIG. 2I, the photoresist pattern layer PR is removed and portions of the seed layer 410, which are not covered by the conductive pillars 420 and the solder material 430, are exposed. The photoresist pattern layer PR may be removed/stripped through, for example, etching, ashing, or other suitable removal processes.

Figure 2J:
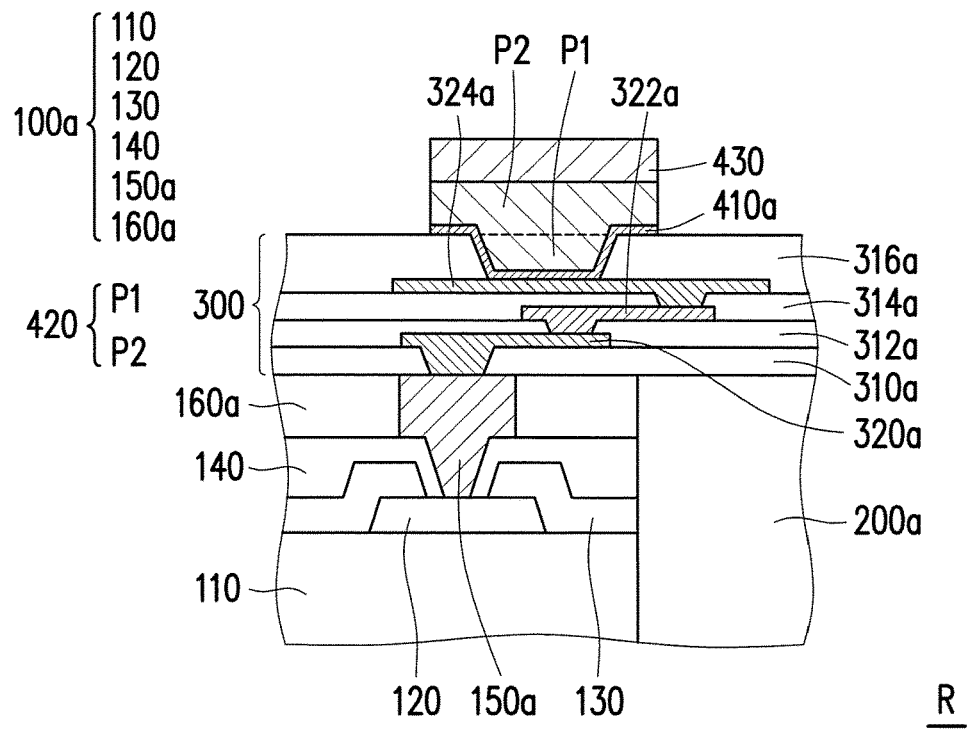
Figure 2K:
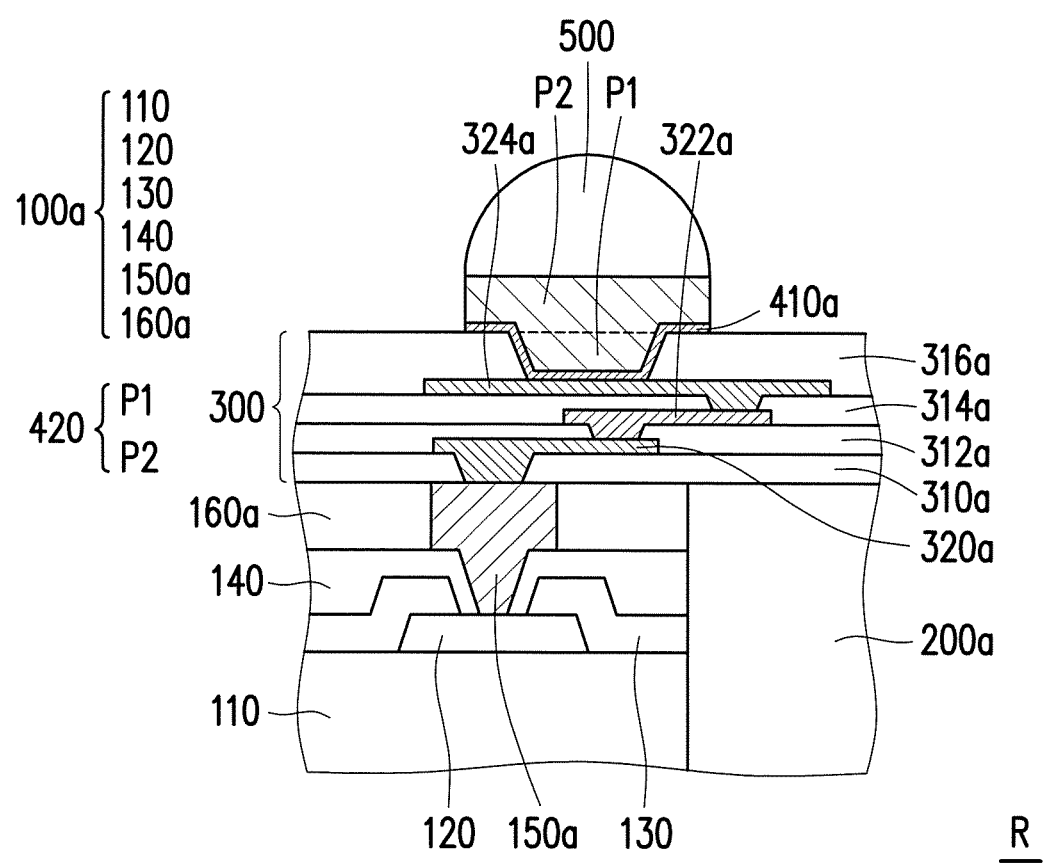

Referring to FIG. 2J, the seed layer 410 that is not covered by the conductive pillars 420 and the solder material 430 is removed to render a seed layer 410a sandwiched between the conductive pillars 420 and the fourth dielectric layer 316a and between the conductive pillars 420 and the third conductive patterns 324a. The exposed portions of the seed layer 410 may be removed through an etching process. In some embodiments, the material of the conductive pillars 420 may be different from the material of the seed layer 410, so the exposed portion of the seed layer 410 may be removed through selective etching. In some embodiments, the conductive pillars 420 may be divided into a first portion P1 embedded in the fourth dielectric layer 316a and a second portion P2 over the fourth dielectric layer 316a. The seed layer 410a is located between the second portion P2 and the fourth dielectric layer 316a, between the first portion P1 and the fourth dielectric layer 316a, and between the first portion P1 and the third conductive patterns 324a, as illustrated in FIG. 2J. Referring to FIG. 2K, a reflow process is performed on the solder material 430 to transform the solder material 430 into conductive bumps 500. As illustrated in FIG. 2K, the conductive bumps 500 after the reflow process exhibits a hemispherical shape. However, the disclosure is not limited thereto. In some alternative embodiments, the conductive bumps 500 may take other forms after the reflow process.

FIGS. 3A-3J are schematic enlarged cross-sectional views illustrating processes of a manufacturing method for an exemplary package focused in a region R in accordance with some alternative embodiments of the disclosure. FIGS. 3A-3J illustrated detailed process steps for forming the redistribution structure 300, the conductive pillars 420, and the conductive bumps 500 on the encapsulant 200a and dies 100a similar to the structures depicted in FIGS. 1C-1D.

Figure 3A:
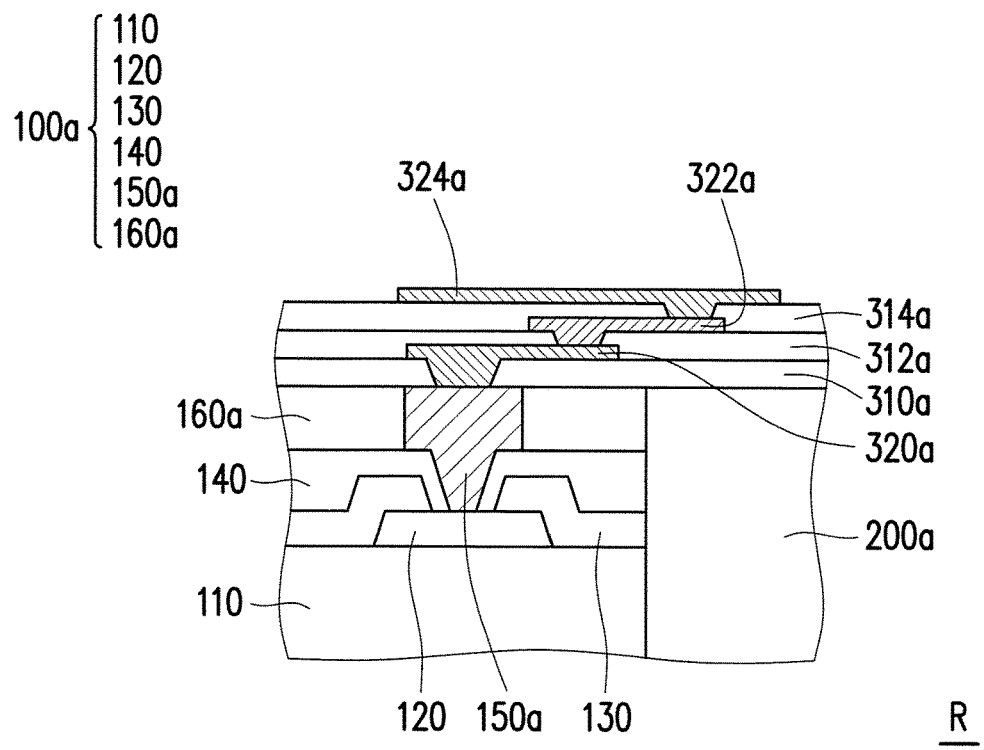

Referring to FIG. 3A, the first dielectric layer 310a, the first conductive patterns 320a, the second dielectric layer 312a, the second conductive patterns 322a, the third dielectric layer 314a, and the third conductive patterns 324a are sequentially formed on the dies 100a and the encapsulant 200a. The process steps for forming these elements are similar to the process steps illustrated in FIGS. 2A-2C, so the detailed description thereof is omitted herein.

Figure 3B:
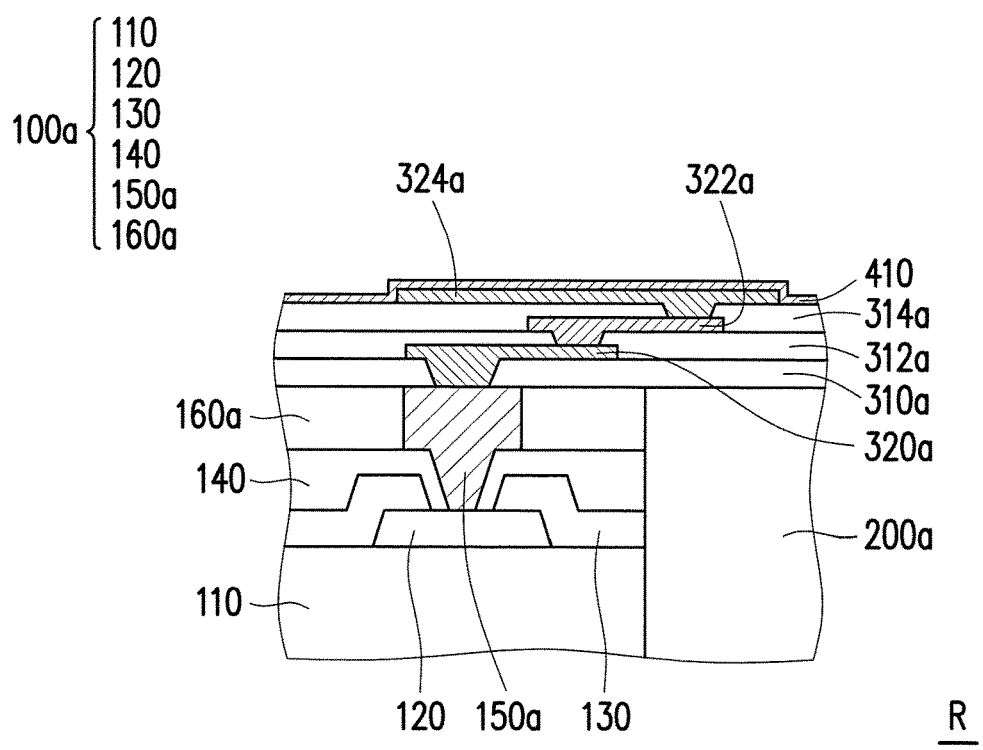

Referring to FIG. 3B, a first seed layer 410 is formed on the third dielectric layer 314a and the third conductive patterns 324a. The first seed layer 410 may be formed through, for example, a sputtering process, a physical vapor deposition (PVD) process, or the like. In some embodiments, the first seed layer 410 may include, for example, copper, titanium-copper alloy, or other suitable choice of materials.

Figure 3C:
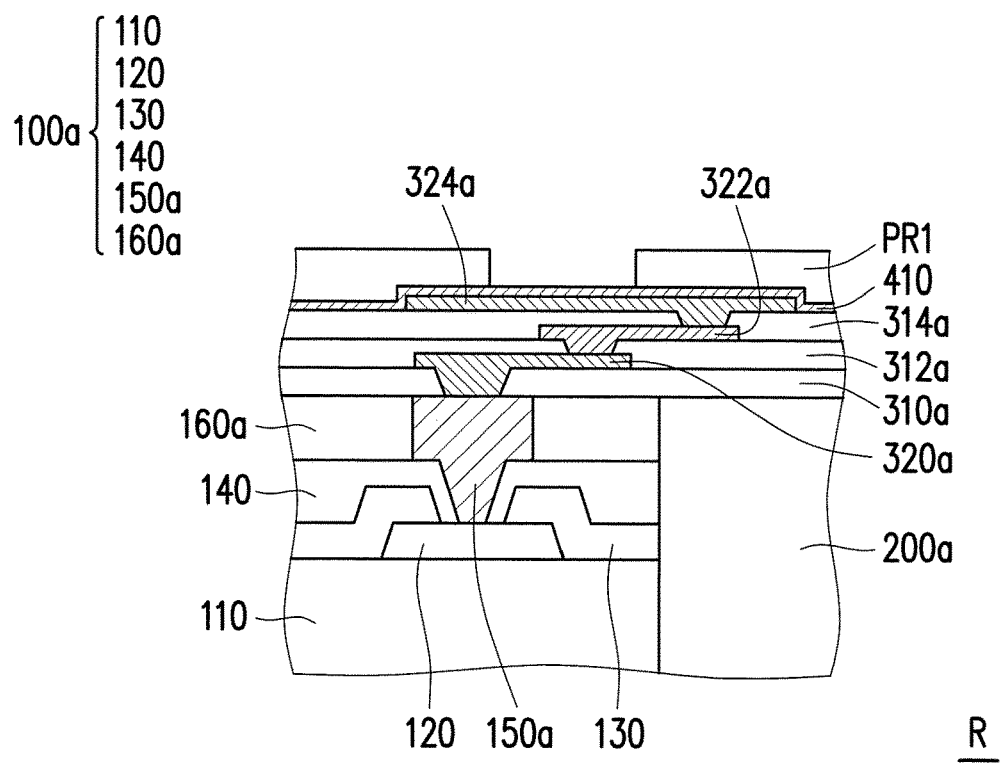

Referring to FIG. 3C, a first photoresist pattern layer PR1 is formed over the first seed layer 410. In some embodiments, the first photoresist pattern layer PR1 exposes at least a portion of the first seed layer 410 located over the third conductive patterns 324a.

Figure 3D:
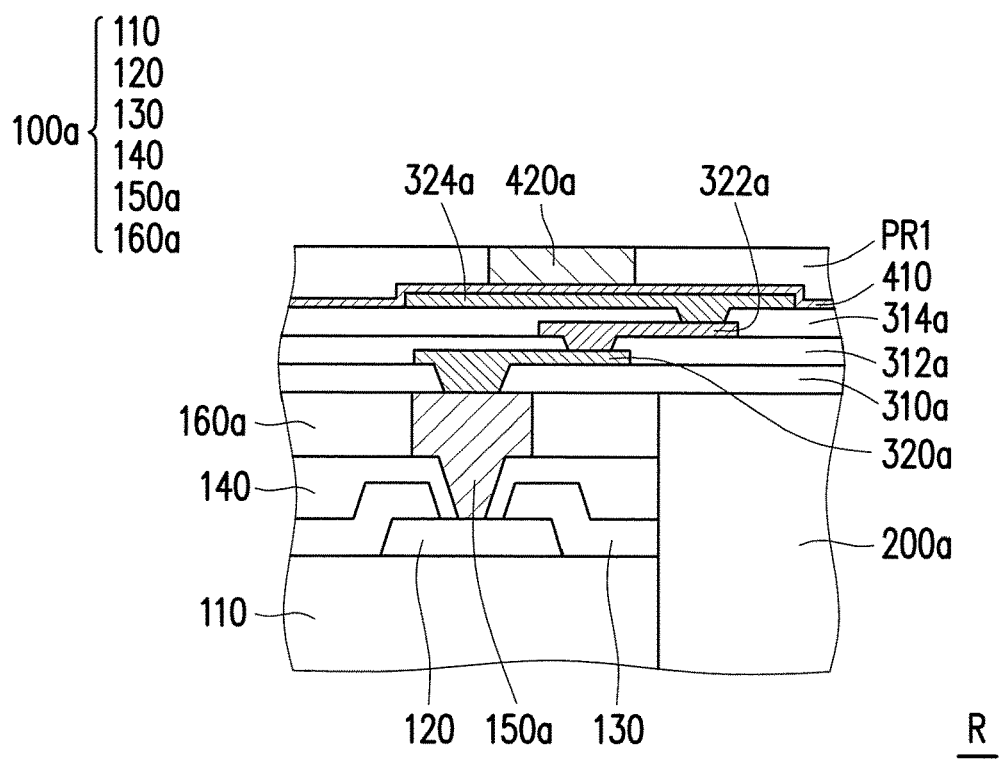

Referring to FIG. 3D, a first conductive material 420a is deposited onto the exposed first seed layer 410 using the first photoresist pattern layer PR1 as a mask. In some embodiments, the first conductive material 420a may be formed by a plating process. The plating process is, for example, electro-plating, electroless-plating, immersion plating, or the like. In some embodiments, the first conductive material 420a includes, for example, copper, copper alloys, or the like.

Figure 3E:
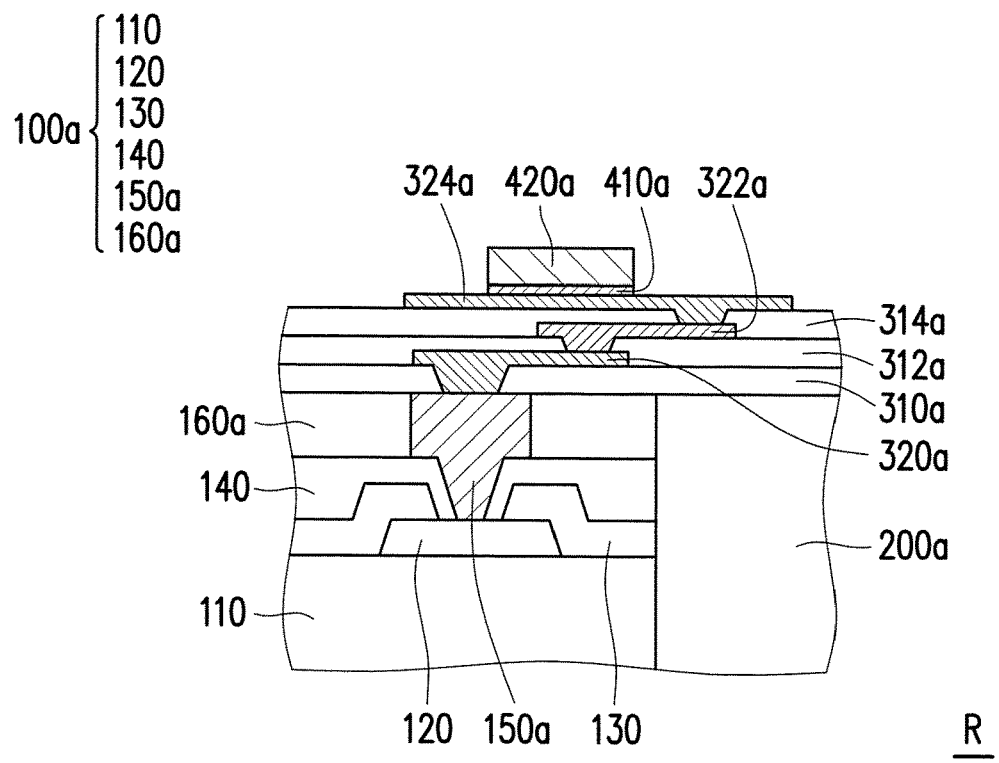

Referring to FIG. 3E, the first photoresist pattern layer PR1 is removed and portions of the first seed layer 410, which are not covered by the first conductive material 420a, are exposed. The first photoresist pattern layer PR1 may be removed/stripped through, for example, etching, ashing, or other suitable removal processes. Subsequently, the first seed layer 410 not covered by the first conductive material 420a is removed to render a first seed layer 410a sandwiched between the first conductive material 420a and the third conductive patterns 324a. The exposed portion of the first seed layer 410 may be removed through an etching process.

Figure 3F:
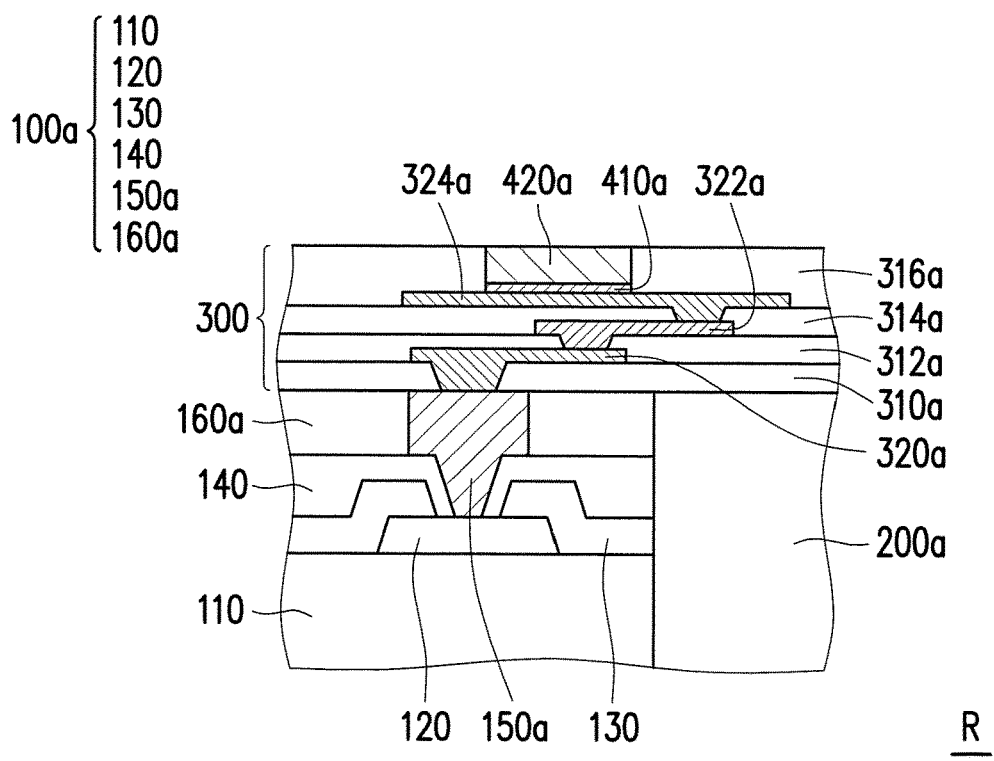

Referring to FIG. 3F, the fourth dielectric layer 316a is formed around the first seed layer 410a and the first conductive material 420a. Similar to the embodiment of FIGS. 2A-2K, in some embodiments, the material of the fourth dielectric layer 316a is different from the materials of the first dielectric layer 310a, the second dielectric layer 312a, and the third dielectric layer 314a. For example, the fourth dielectric layer 316a has a Young's modulus higher than the Young's modulus of the first dielectric layer 310a, the second dielectric layer 312a, and the third dielectric layer 314a. In some embodiments, due to higher Young's modulus, the fourth dielectric layer 316a of the redistribution structure 300 may be referred to as an anti-stress layer.

Figure 3G:
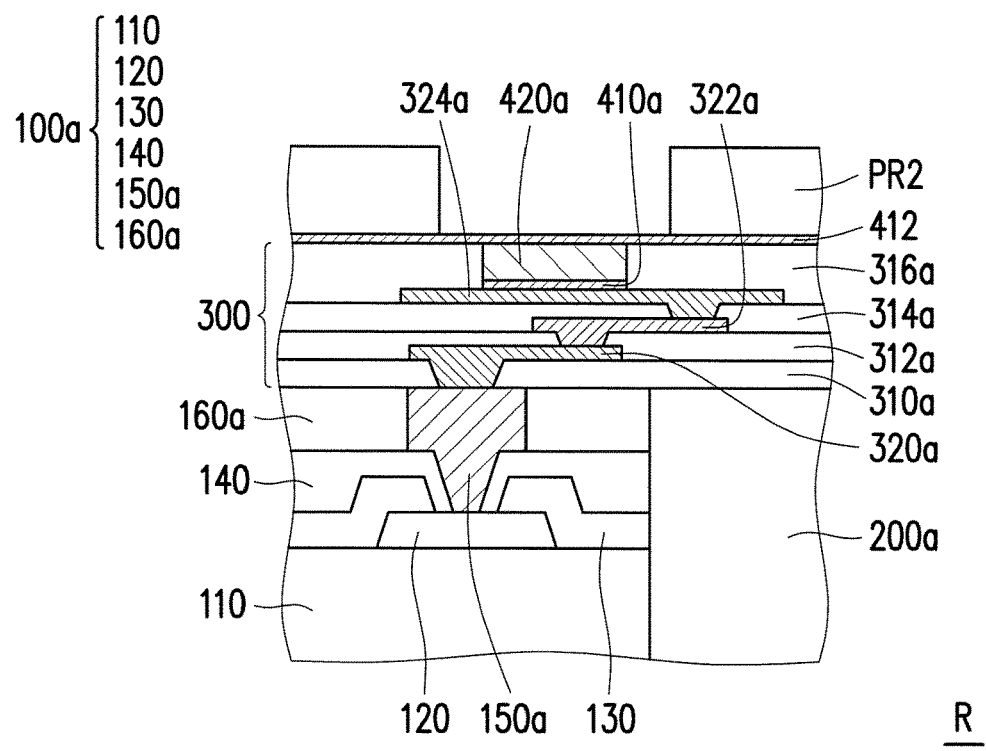

Referring to FIG. 3G, a second seed layer 412 may be formed over the fourth dielectric layer 316a and the first conductive material 420a. Subsequently, a second photoresist pattern layer PR2 is formed over the second seed layer 412. In some embodiments, the second photoresist pattern layer PR2 exposes at least a portion of the second seed layer 412 located on the first conductive material 420a. The second seed layer 412 may be similar to the first seed layer 410 and the second photoresist pattern layer PR2 may be similar to the first photoresist pattern layer PR1, so the detailed description thereof is omitted herein.

Figure 3H:
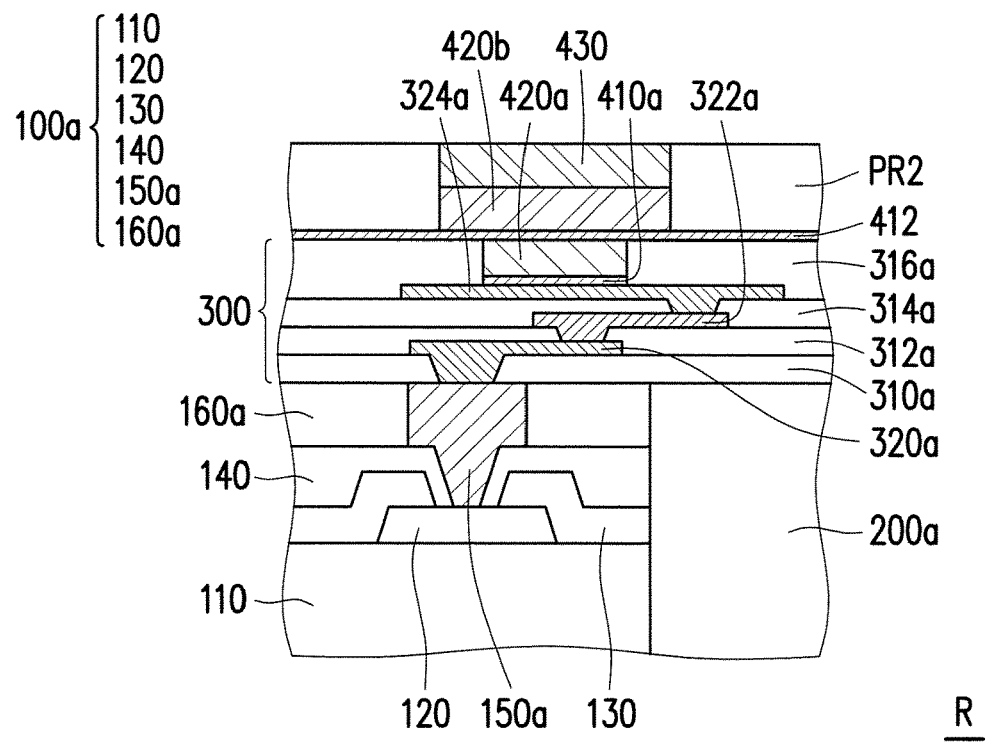
Figure 31:
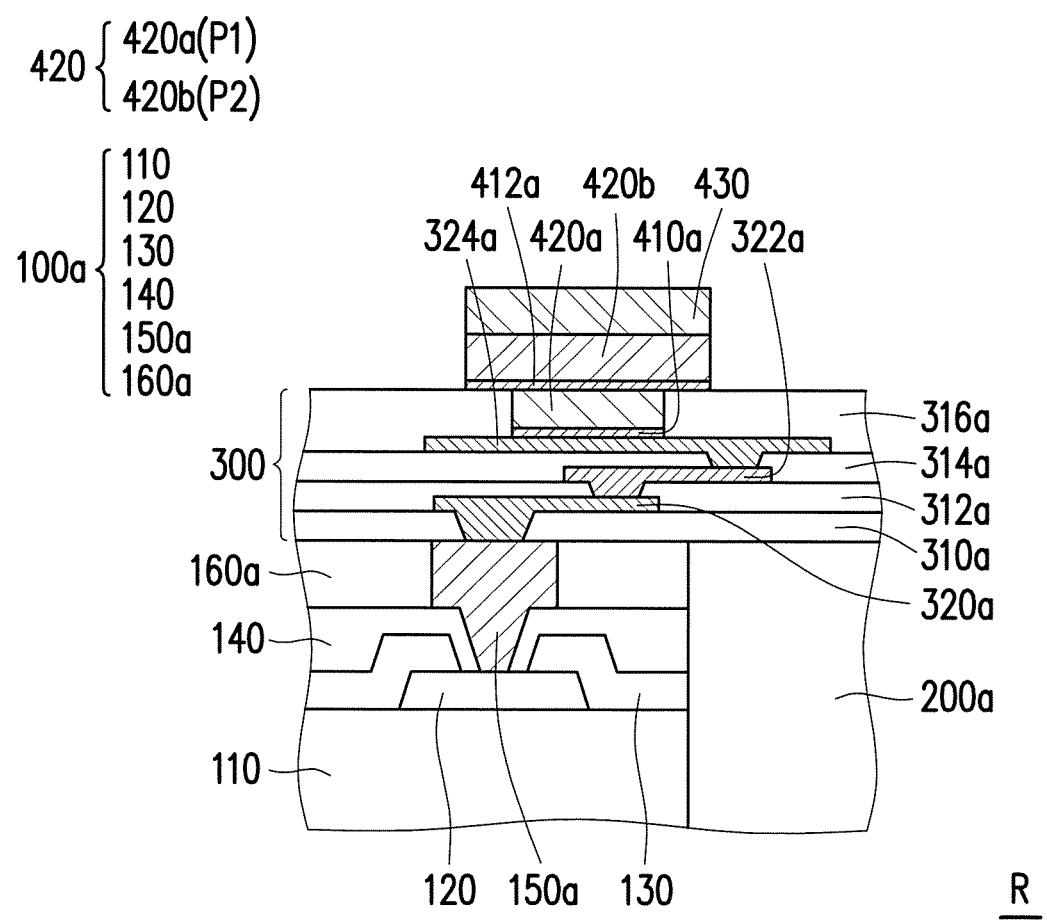

Referring to FIG. 3H, a second conductive material 420b and a solder material 430 are deposited onto the exposed second seed layer 412 using the second photoresist pattern layer PR2 as a mask. The second conductive material 420b may be similar to the first conductive material 410b, so the detailed description thereof is omitted herein.

Figure 3J:
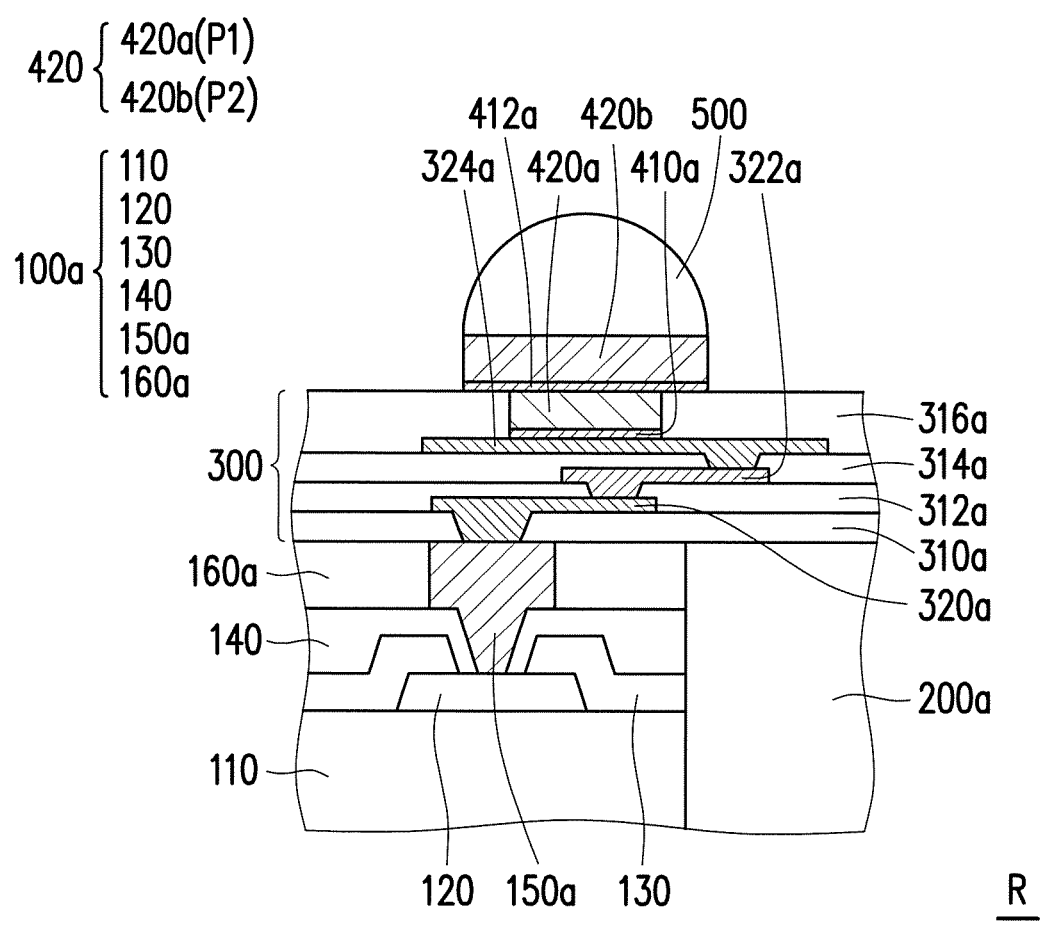

Referring to FIG. 3I, the second photoresist pattern layer PR2 is removed and portions of the second seed layer 412, which are not covered by the second conductive material 420b and the solder material 430, are exposed. The second photoresist pattern layer PR2 may be removed/stripped through, for example, etching, ashing, or other suitable removal processes. Subsequently, the second seed layer 412 not covered by the second conductive material 420b and the solder material 430 is removed to render a second seed layer (additional seed layer) 412a sandwiched between the second conductive material 420b and the first conductive material 420a and between the second conductive material 420b and the fourth dielectric layer 316a. The exposed portion of the second seed layer 412 may be removed through an etching process. Referring to FIG. 3I, the first conductive material 420a and the second conductive material 420b constitute the conductive pillars 420. In some embodiments, the first conductive material 420a may be referred to as a first portion P1 of the conductive pillars 420 embedded in the fourth dielectric layer 316a. On the other hand, the second conductive material 420b may be referred to as a second portion P2 of the conductive pillars 420 over the fourth dielectric layer 316a. The first seed layer 410a is located between the first portion P1 and the third conductive patterns 324a. The second seed layer 412a is located between the first portion P1 and the second portion P2 and between the fourth dielectric layer 316a and the second portion P2. Referring to FIG. 3J, a reflow process is performed on the solder material 430 to transform the solder material 430 into conductive bumps 500.

Figure 4A:
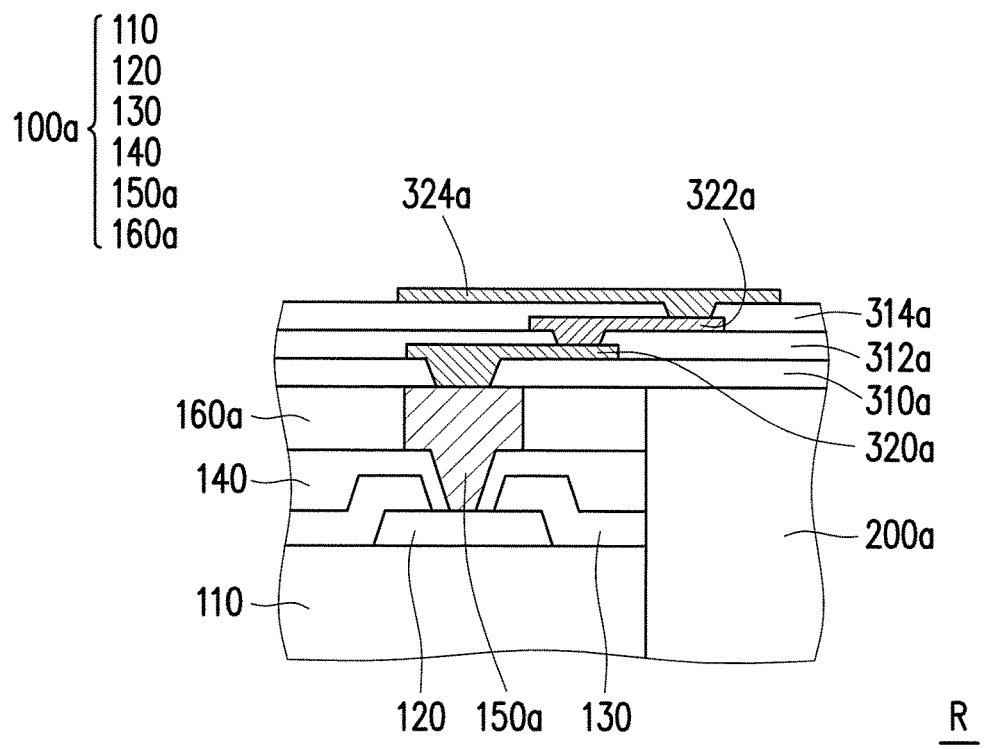
FIGS. 4A-4J are schematic enlarged cross-sectional views illustrating processes of a manufacturing method for an exemplary package focused in a region R in accordance with some alternative embodiments of the disclosure.

FIGS. 4A-4J are schematic enlarged cross-sectional views illustrating processes of a manufacturing method for an exemplary package focused in a region R in FIG. 1C in accordance with some alternative embodiments of the disclosure. FIGS. 4A-4J illustrated detailed process steps for forming the redistribution structure 300, the buffer layer 600a, the conductive pillars 420, and the conductive bumps 500 on the encapsulant 200a and dies 100a similar to the structures depicted in FIGS. 1C-1D. Referring to FIG. 4A, the first dielectric layer 310a, the first conductive patterns 320a, the second dielectric layer 312a, the second conductive patterns 322a, the third dielectric layer 314a, and the third conductive patterns 324a are sequentially formed on the dies 100a and the encapsulant 200a. The process steps for forming these elements are similar to the process steps illustrated in FIGS. 2A-2C, so the detailed description thereof is omitted herein.

Figure 4B:
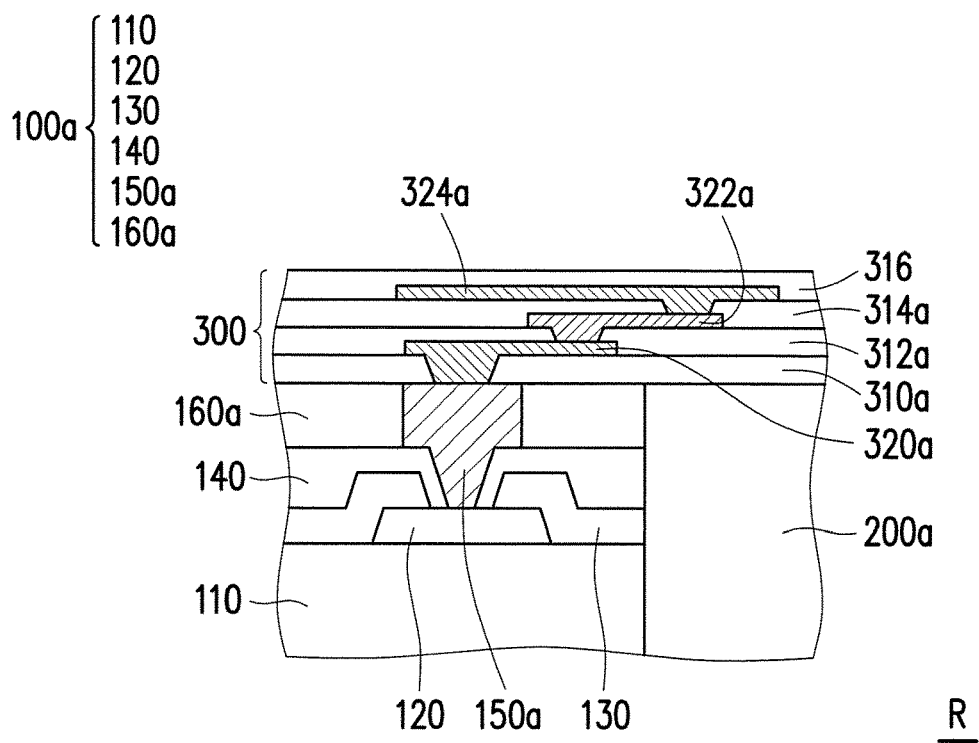
Figure 4C:
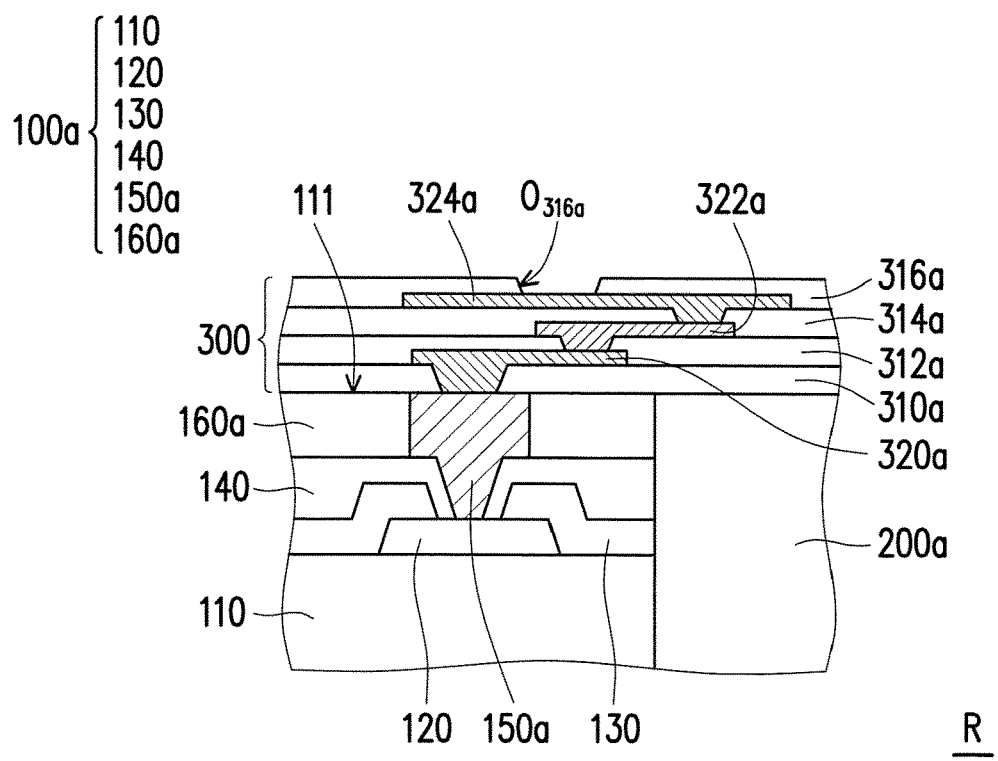

Referring to FIG. 4B and FIG. 4C, the fourth dielectric layer 316a is formed over the third dielectric layer 314a and the third conductive patterns 324a. The fourth dielectric layer 316a may be formed by first forming a dielectric material layer 316 over the third dielectric layer 314a and the third conductive patterns 324a. Subsequently, the dielectric material layer 316 is patterned to form the fourth dielectric layer 316a having a plurality of openings $O_{316a}$. The openings $O_{316a}$ expose at least a portion of the third conductive patterns 324a located underneath the fourth dielectric layer 316a. In some embodiments, the dielectric material layer 316 may be patterned through a photolithography process and an etching process. In some embodiments, the material of the fourth dielectric layer 316a is the same as the materials of the first dielectric layer 310a, the second dielectric layer 312a, and the third dielectric layer 314a. In some embodiments, the fourth dielectric layer 316a is referred to as the dielectric layer farthest away from the dies 100a in the direction perpendicular to top surfaces of the dies 100a. Similarly, the third conductive patterns 324a are referred to as the conductive patterns farthest away from the dies 100a in the direction perpendicular to top surfaces of the dies 100a. In some embodiments, the first dielectric layer 310a, the second dielectric layer 312a, the third dielectric layer 314a, the fourth dielectric layer 316a, the first conductive patterns 320a, the second conductive patterns 322a, and the third conductive patterns 324a constitute the redistribution structure 300.

Figure 4D:
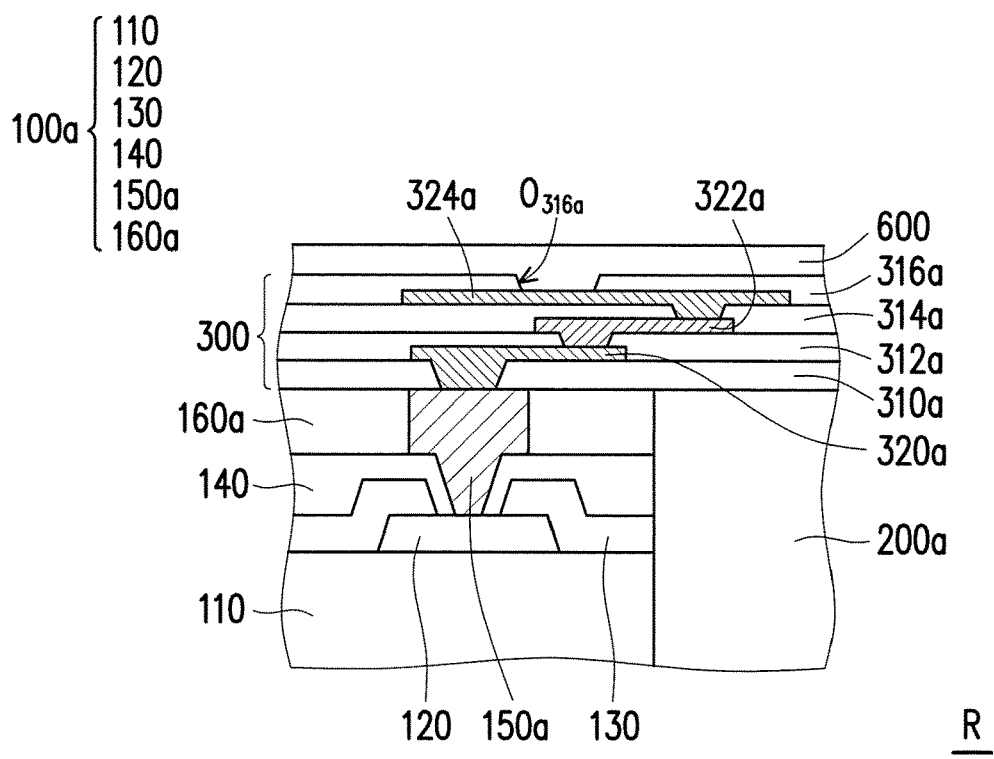

Referring to FIG. 4D, a buffer layer 600 is formed over the fourth dielectric layer 316a and the third conductive patterns 324a. In some embodiments, the material of the buffer layer 600 is different from the materials of the first dielectric layer 310a, the second dielectric layer 312a, the third dielectric layer 314a, and the fourth dielectric layer 316a. For example, the material of the buffer layer 600 may include molding compound materials such as epoxy resins or phenolic resins. In some embodiments, the buffer layer 600 may further include fillers. In some embodiments, the material of the buffer layer 600 may include polyimide, epoxy resin, acrylic resin, phenol resin, benzocyclobutene (BCB), polybenzooxazole (PBO), or any other suitable polymer-based dielectric material. In some embodiments, the buffer layer 600 has a Young's modulus higher than the Young's modulus of the first dielectric layer 310a, the second dielectric layer 312a, the third dielectric layer 314a, and the fourth dielectric layer 316a. For example, the Young's modulus of the buffer layer 600 ranges between 0.5 GPa and 150 GPa. On the other hand, the Young's modulus of the first dielectric layer 310a, the second dielectric layer 312a, the third dielectric layer 314a, and the fourth dielectric layer 316a range between 0.1 GPa and 100 GPa. In certain embodiments, the ratio of the Young's modulus of the buffer layer 600 to the Young's modulus of the first, second, third, or fourth dielectric layer 310a, 312a, 314a, 316a ranges from 1.05 to 100. When the ratio of the Young's modulus is below 1.05, the buffer layer 600 is not able to endure the stress generated from the conductive pillars 420, thereby causing the conductive patterns in the redistribution structure 300 to deform. On the other hand, when the ratio of the Young's modulus is above 100, the buffer layer 600 would exhibit a hardness similar to that of pure silicon, thereby increasing the processing difficulty. In some embodiments, the thickness of the buffer layer 600 is larger than the thickness of the first dielectric layer 310a, the second dielectric layer 312a, the third dielectric layer 314a, or the fourth dielectric layer 316a. In some embodiments, due to the higher Young's modulus, the buffer layer 600 is able to alleviate or block the stress from the conductive pillars 420 to the underlying redistribution structure 300, thus protecting the conductive patterns in the redistribution structure 300 from being damaged by stress generated during assembly processes and/or thermal processes. In other words, the buffer layer 600 with a higher Young's modulus aids to alleviate the problem of fine line deformation in the redistribution structure 300. Therefore, in some embodiments, the buffer layer 600 may be referred to as an anti-stress layer.

Figure 4E:
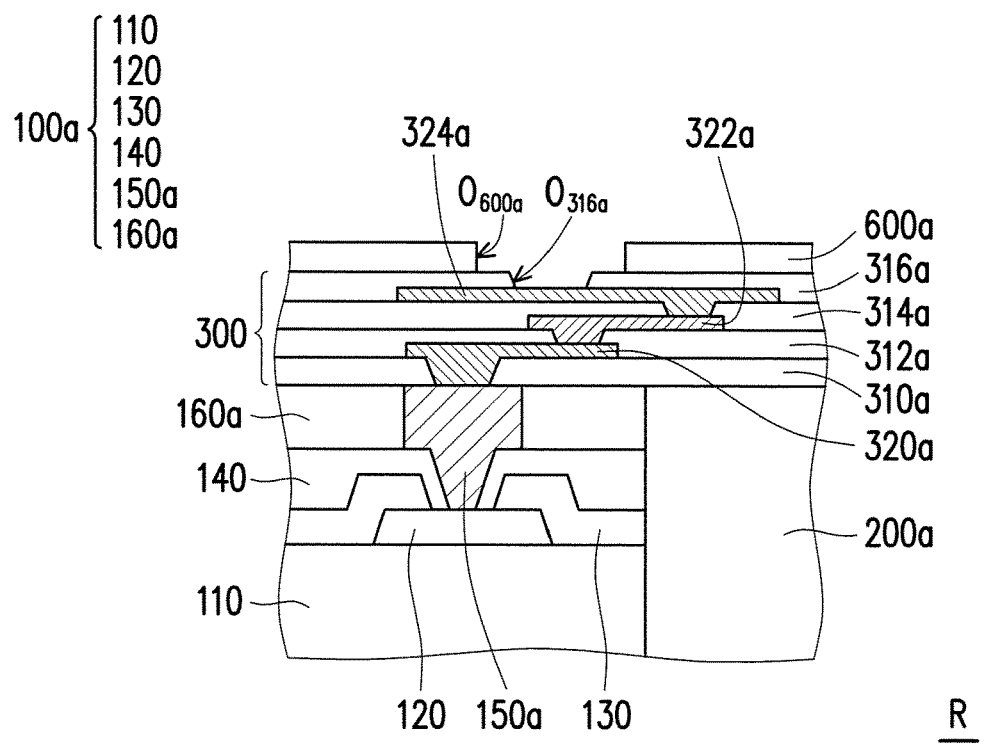

Referring to FIG. 4E, the buffer layer 600 is patterned to form a buffer layer 600a having a plurality of openings $O_{600a}$. The openings $O_{600a}$ is larger than the openings $O_{316a}$ such that the openings $O_{600a}$ expose the openings $O_{316a}$ of the fourth dielectric layer 316a and at least a portion of the fourth dielectric layer 316a.

Figure 4F:
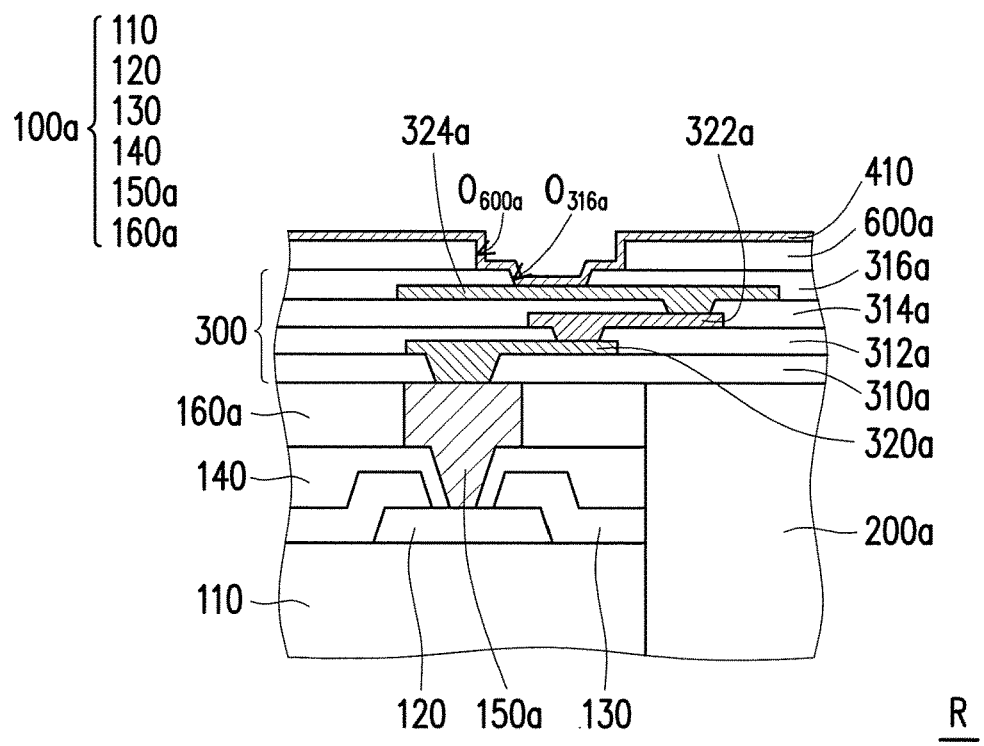

Referring to FIG. 4F, in some embodiments, a seed layer 410 is formed covering the openings $O_{316a}$ and the openings $O_{600a}$ and over the buffer layer 600a. As illustrated in FIG. 4F, the seed layer 410 is formed in a conformal manner covering the profiles of the openings $O_{316a}$ and openings $O_{600a}$. That is, the seed layer 410 extends into the openings $O_{316a}$ and openings $O_{600a}$ to cover bottom surfaces and sidewalls of the openings $O_{316a}$ and openings $O_{600a}$. The seed layer 410 may be formed through, for example, a sputtering process, a physical vapor deposition (PVD) process, or the like. In some embodiments, the seed layer 410 may include, for example, copper, titanium-copper alloy, or other suitable choice of materials.

Figure 4G:
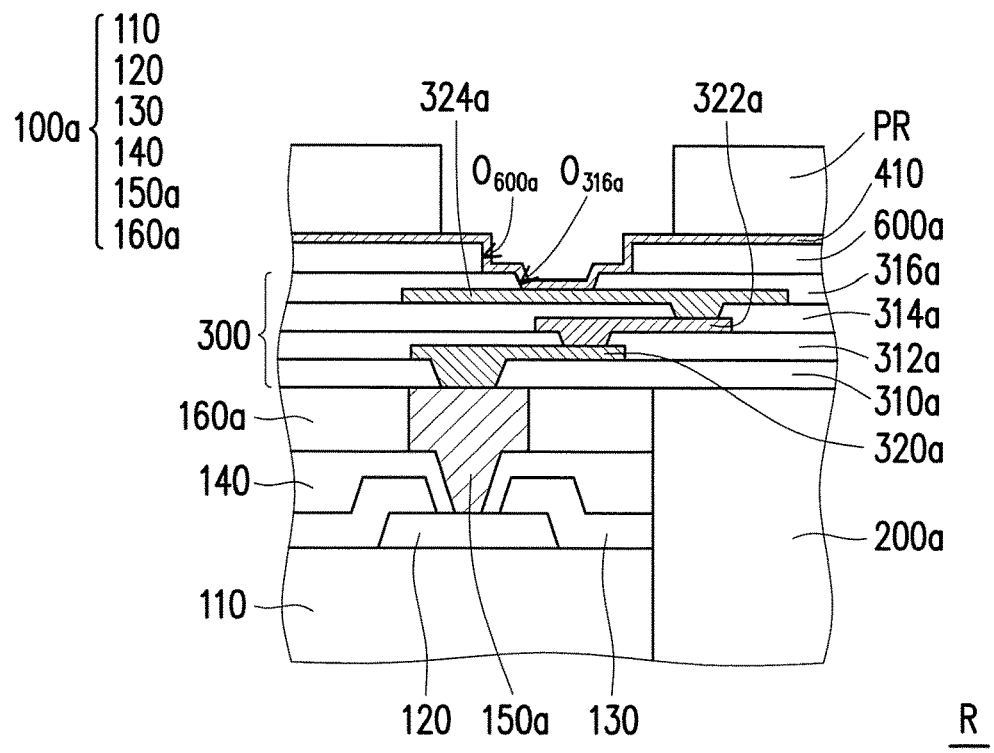

Referring to FIG. 4G, a photoresist pattern layer PR is formed over the seed layer 410. In some embodiments, the photoresist pattern layer PR exposes the seed layer 410 located in the openings $O_{316a}$ and the openings $O_{600a}$. The photoresist pattern layer PR also exposes at least a portion of the seed layer 410 located on the buffer layer 600a and around the openings $O_{600a}$.

Figure 4H:
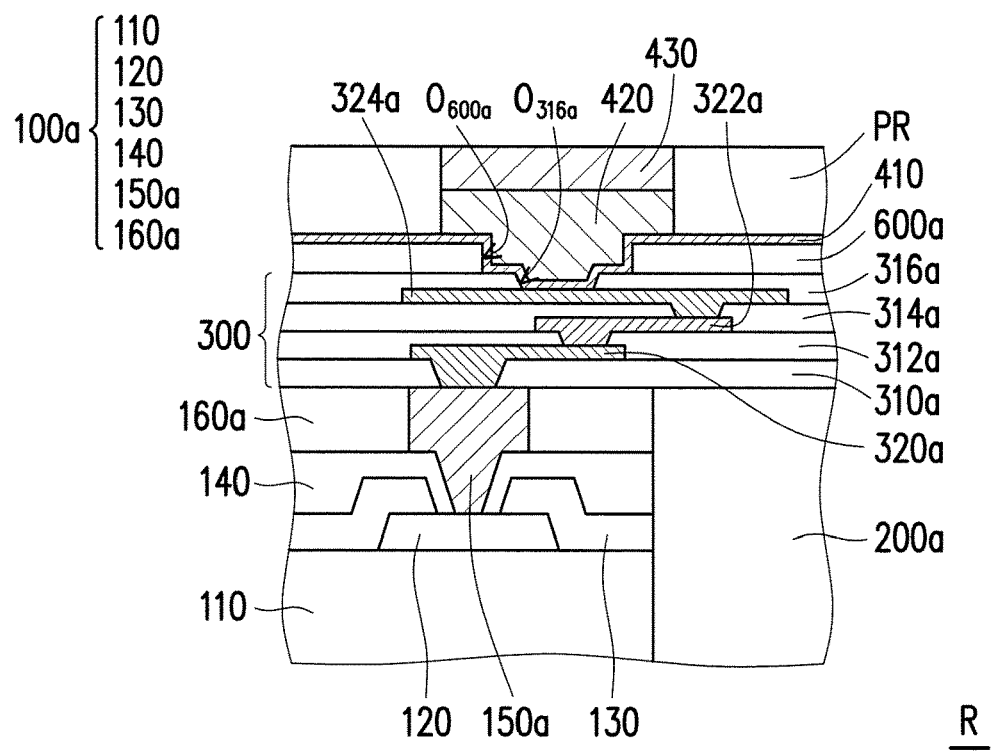

Referring to FIG. 4H, in some embodiments, conductive pillars 420 are formed on the seed layer 410 within the openings $O_{316a}$ and openings $O_{600a}$. In some embodiments, a conductive material (not shown) is deposited onto the exposed seed layer 410 to form the conductive pillars 420. Subsequently, a solder material 430 is deposited onto the conductive pillars 420. In some embodiments, the conductive material and the solder material 430 may be formed by a plating process. The plating process is, for example, electro-plating, electroless-plating, immersion plating, or the like. In some embodiments, the conductive material includes, for example, copper, copper alloys, or the like.

Figure 4I:
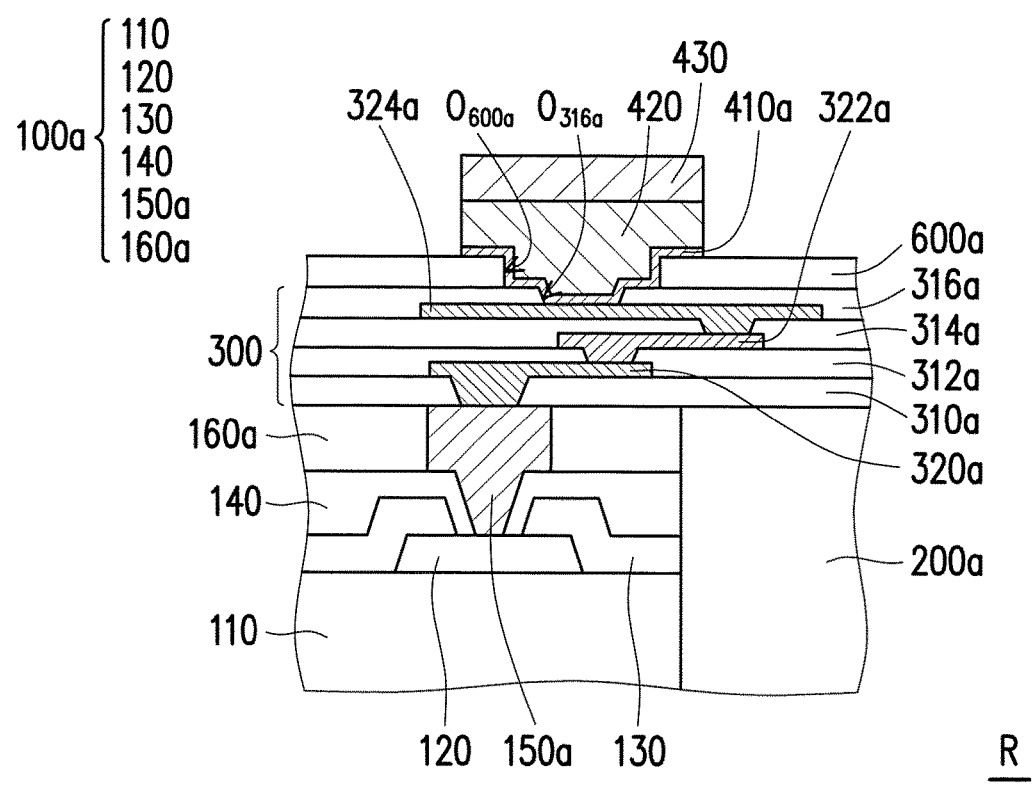
Figure 4J:
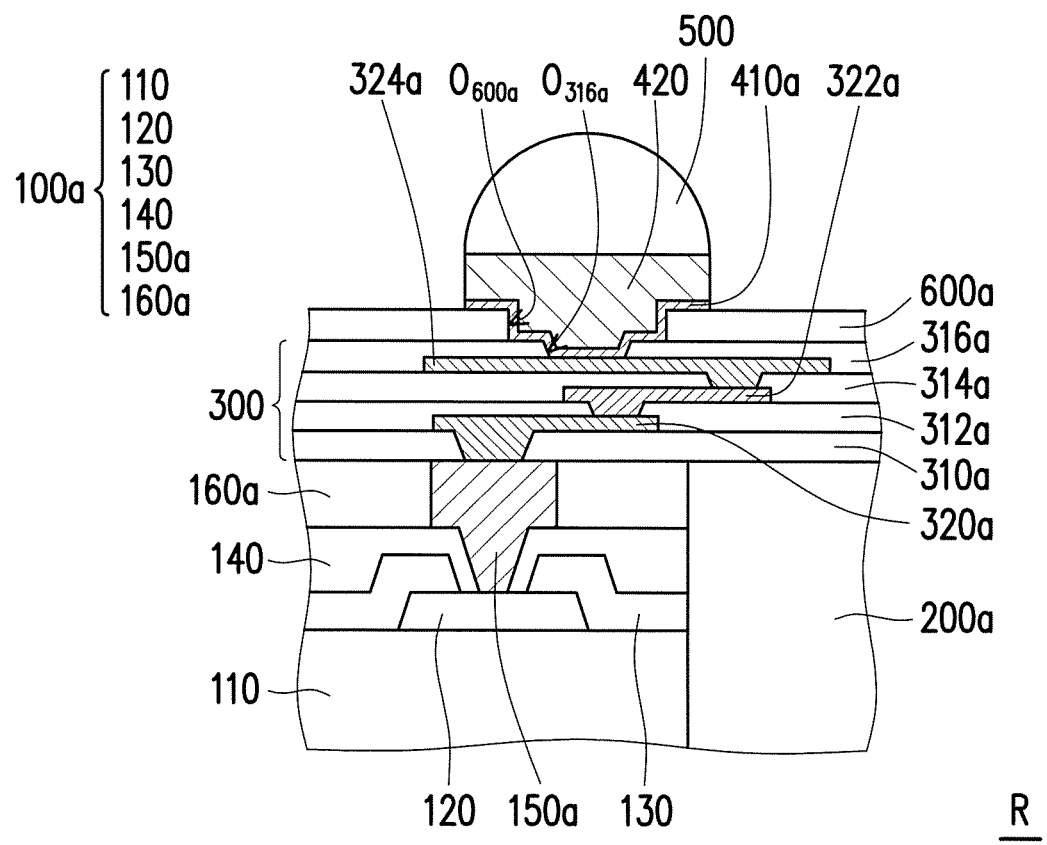

Referring to FIG. 4I, the photoresist pattern layer PR is removed and portions of the seed layer 410, which are not covered by the conductive pillars 420 and the solder material 430, are exposed. The photoresist pattern layer PR may be removed/stripped through, for example, etching, ashing, or other suitable removal processes. Subsequently, the seed layer 410 that is not covered by the conductive pillars 420 and the solder material 430 is removed to render a seed layer 410a sandwiched between the conductive pillars 420 and the buffer layer 600a, between the conductive pillars 420 and the fourth dielectric layer 316a, and between the conductive pillars 420 and the third conductive patterns 324a. The exposed portion of the seed layer 410 may be removed through an etching process. Referring to FIG. 4J, a reflow process is performed on the solder material 430 to transform the solder material 430 into conductive bumps 500.

Figure 5A:
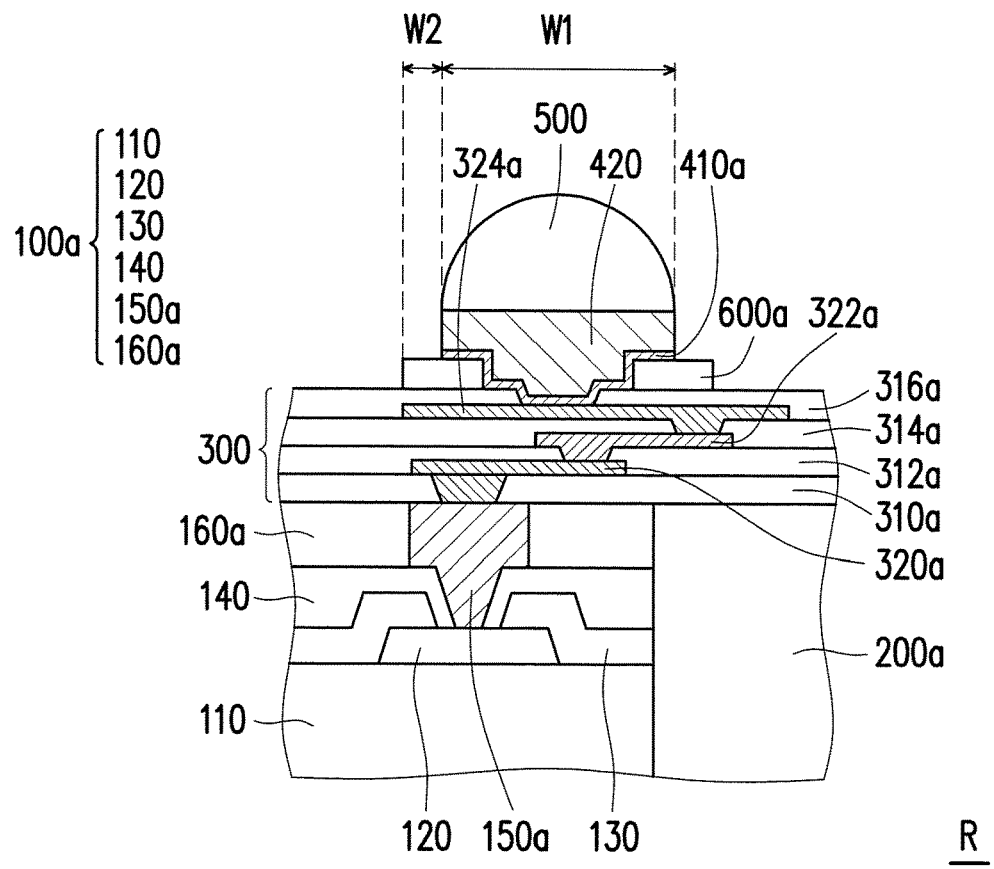
FIG. 5A is a schematic enlarged cross-sectional view illustrating an exemplary package focused in a region R in accordance with some alternative embodiments of the disclosure.
Figure 5B:
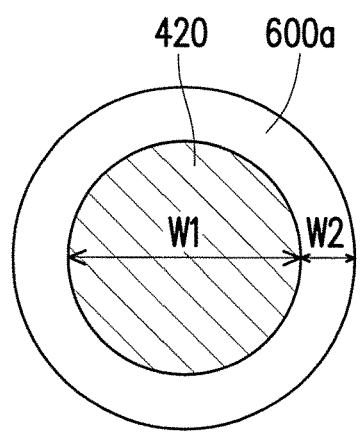
FIG. 5B is a schematic top view illustrating the buffer layer and the conductive pillar in FIG. 5A.

FIG. 5A is a schematic enlarged cross-sectional view illustrating an exemplary package focused in a region R in accordance with some alternative embodiments of the disclosure. FIG. 5B is a schematic top view illustrating a buffer layer 600a and a conductive pillar 420 in FIG. 5A. The structure illustrated in FIG. 5A is similar to the structure illustrated in FIG. 4J except for the location or coverage of the buffer layer 600a. In other words, the structure illustrated in FIG. 5A may be obtained by the process steps similar to the process steps illustrated in FIGS. 4A-4J, so the detailed description thereof is omitted herein. In some embodiments, an extra step of removing at least a portion of the buffer layer 600a over the fourth dielectric layer 316a may be performed to obtain a ring-shaped buffer layer 600a surrounding the conductive pillars 420. Referring to FIG. 5A and FIG. 5B, the conductive pillars 420 are depicted as round conductive pillars and the ring-shaped buffer layer 600a surrounding each conductive pillar 420 is depicted as a round ring-shaped doughnut structure as examples for illustration purposes, but are not intended to limit the scope of the disclosure. In some embodiments, each conductive pillar 420 has a maximum diameter of W1. On the other hand, an edge of the ring-shaped buffer layer 600a and a sidewall of the conductive pillar 420 has a distance of W2. In some embodiments, a ratio of W2 to W1 (W2/W1) ranges between 0.01 and 0.6. Although FIG. 5B illustrated that the conductive pillars 420 are depicted as round cylinders and the buffer layer surrounding the pillars has a corresponding shape, various shapes and different compatible shapes may be adopted, and the disclosure is not limited thereto. In some alternative embodiments, the conductive pillars 420 may be elliptical columns or even square or polygonal columns. Moreover, although FIG. 5A illustrated that the outer sidewalls of the ring-shaped buffer layer 600a are straight, the disclosure is not limited thereto. In some alternative embodiments, the outer sidewalls of the ring-shaped buffer layer 600a may be slanted to further enhance the strength of the buffer layer 600a.

Figure 6A:
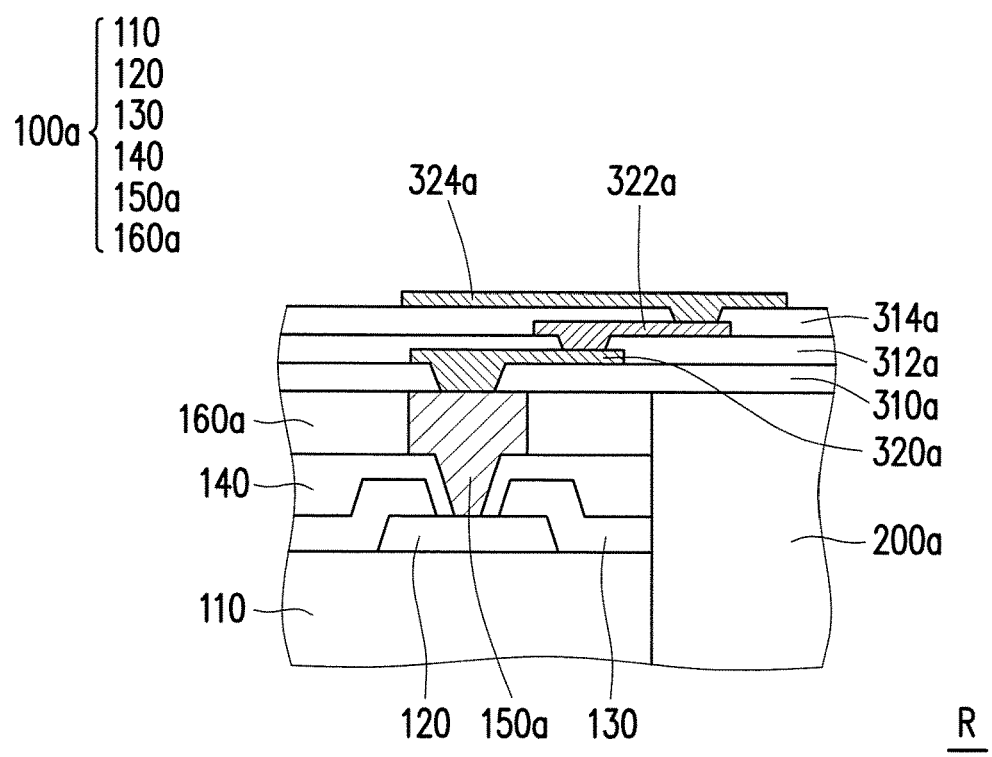
FIGS. 6A-6I are schematic enlarged cross-sectional views illustrating processes of a manufacturing method for an exemplary package focused in a region R in accordance with some alternative embodiments of the disclosure.
Figure 6B:
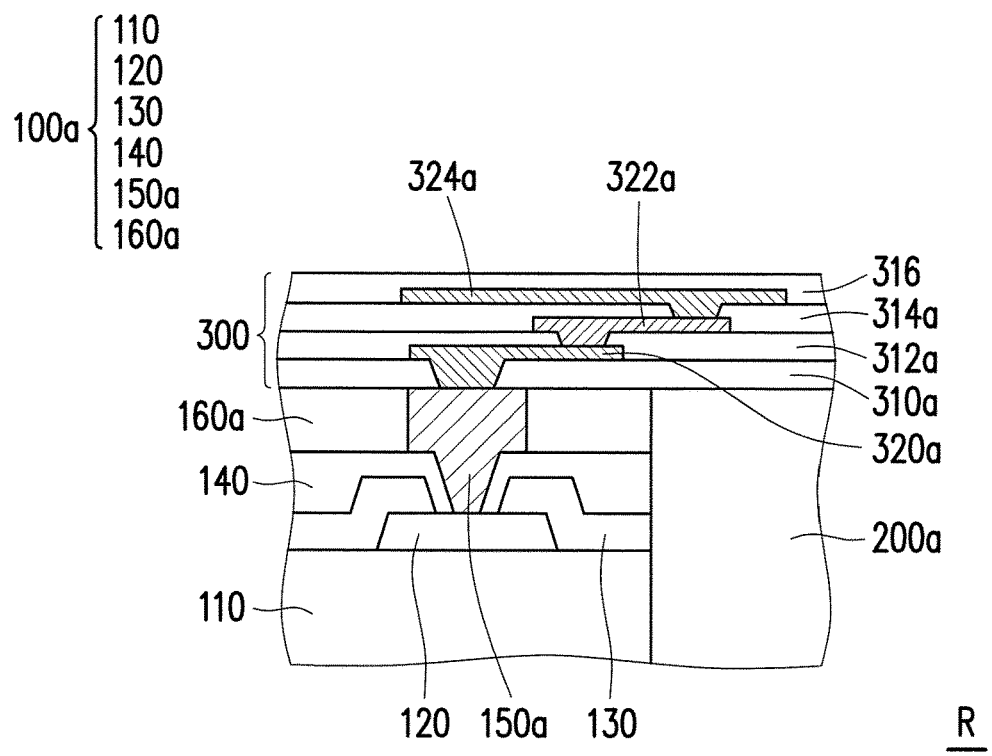
Figure 6C:
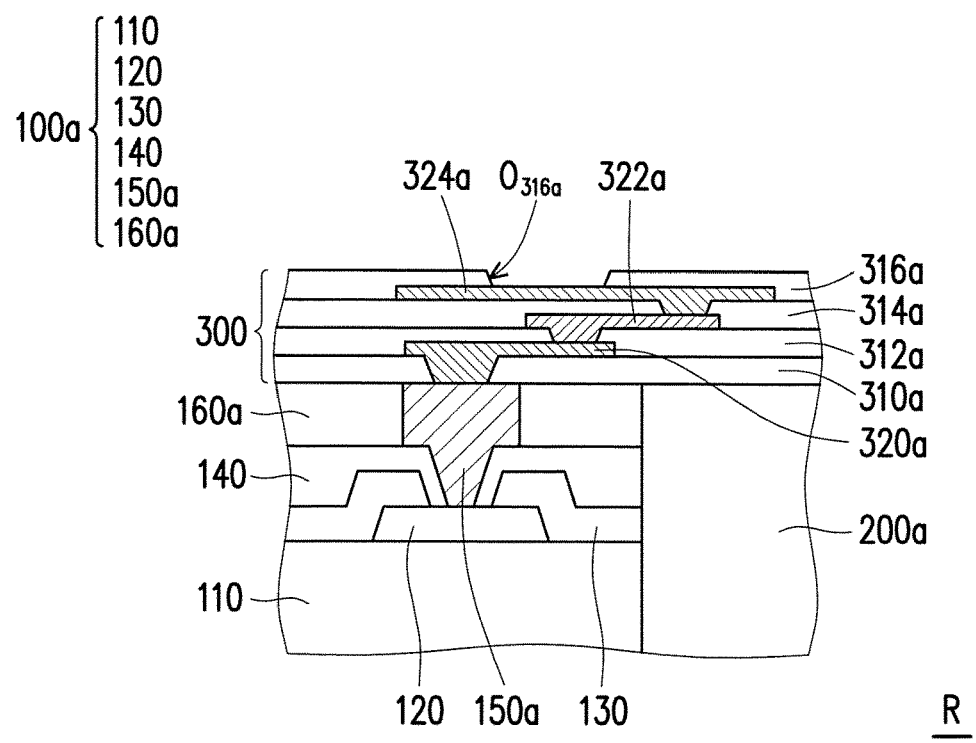

FIGS. 6A-6I are schematic enlarged cross-sectional views illustrating processes of a manufacturing method for an exemplary package focused in a region R in FIG. 1C in accordance with some alternative embodiments of the disclosure. FIGS. 6A-6I illustrated detailed process steps for forming the redistribution structure 300, the buffer layer 600a, the conductive pillars 420, and the conductive bumps 500 on the encapsulant 200a and dies 100a similar to the structures depicted in FIGS. 1C-1D. Referring to FIGS. 6A-6C, the process steps illustrated is similar to the process steps in FIGS. 4A-4C, so the detailed descriptions thereof is omitted herein.

Figure 6D:
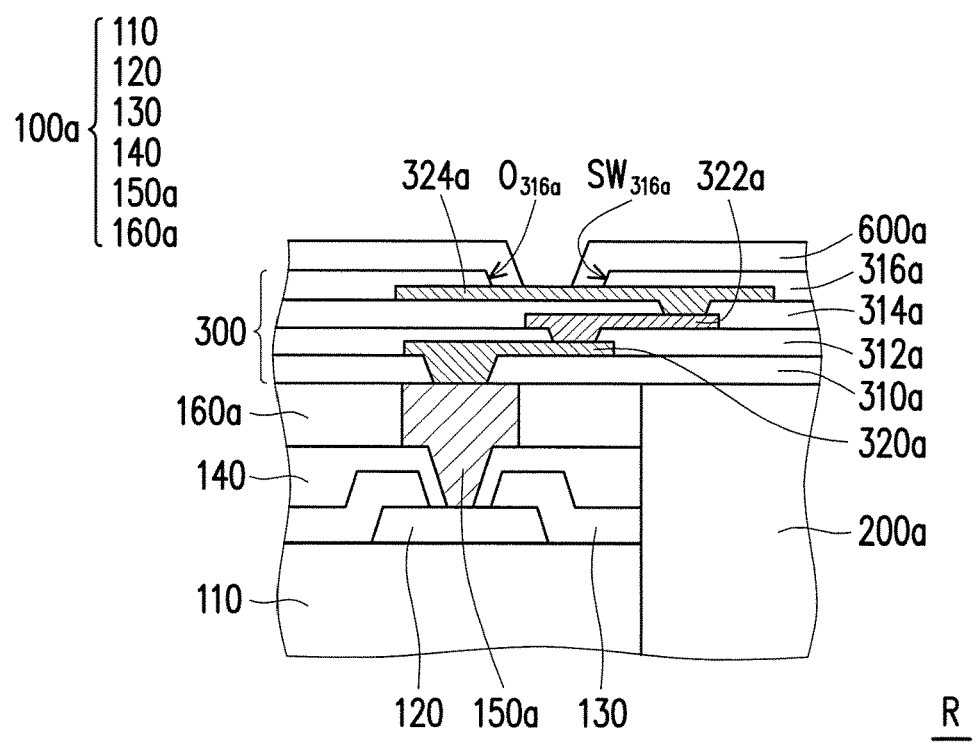

Referring to FIG. 6D, a buffer layer 600a is formed over the fourth dielectric layer 316a and the third conductive patterns 324a. In some embodiments, the buffer layer 600a extends into the openings $O_{316a}$ to cover sidewalls $SW_{316a}$ of the openings $O_{316a}$. The buffer layer 600a exposes at least a portion of a bottom surface of the openings $O_{316a}$. In other words, the buffer layer 600a exposes at least a portion of the third conductive patterns 324a. In some embodiments, the material of the buffer layer 600 is different from the materials of the first dielectric layer 310a, the second dielectric layer 312a, the third dielectric layer 314a, and the fourth dielectric layer 316a. For example, the material of the buffer layer 600a may include molding compound materials such as epoxy resins or phenolic resins. In some embodiments, the buffer layer 600a may further include fillers. In some embodiments, the material of the buffer layer 600a may include polyimide, epoxy resin, acrylic resin, phenol resin, benzocyclobutene (BCB), polybenzooxazole (PBO), or any other suitable polymer-based dielectric material. In some embodiments, the buffer layer 600a has a Young's modulus higher than the Young's modulus of the first dielectric layer 310a, the second dielectric layer 312a, the third dielectric layer 314a, and the fourth dielectric layer 316a. For example, the Young's modulus of the buffer layer 600a ranges between 0.5 GPa and 150 GPa. On the other hand, the Young's modulus of the first dielectric layer 310a, the second dielectric layer 312a, the third dielectric layer 314a, and the fourth dielectric layer 316a range between 0.1 GPa and 100 GPa. In certain embodiments, the ratio of the Young's modulus of the buffer layer 600a to the Young's modulus of the first, second, third, or fourth dielectric layer 310a, 312a, 314a, 316a ranges from 1.05 to 100. When the ratio of the Young's modulus is below 1.05, the buffer layer 600a is not able to endure the stress generated from the conductive pillars 420, thereby causing the conductive patterns in the redistribution structure 300 to deform. On the other hand, when the ratio of the Young's modulus is above 100, the buffer layer 600a would exhibit a hardness similar to pure silicon, thereby increasing the processing difficulty. In some embodiments, the thickness of the buffer layer 600a is larger than the thickness of the first dielectric layer 310a, the second dielectric layer 312a, the third dielectric layer 314a, or the fourth dielectric layer 316a. In some embodiments, due to the higher Young's modulus, the buffer layer 600a is able to alleviate or block the stress from the conductive pillars 420 to the underlying redistribution structure 300, thus protecting the conductive patterns in the redistribution structure 300 from being damaged by stress generated during assembly processes and/or thermal processes. In other words, the buffer layer 600a with a higher Young's modulus aids to alleviate the problem of fine line deformation in the redistribution structure 300. Therefore, in some embodiments, the buffer layer 600a may be referred to as an anti-stress layer.

Figure 6E:
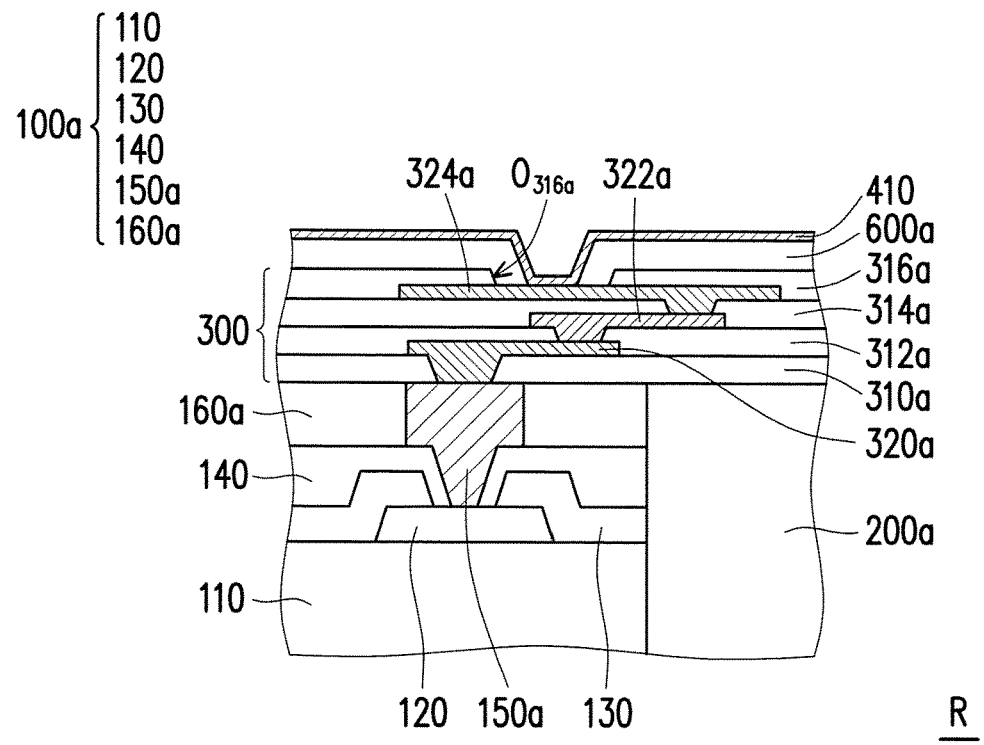

Referring to FIG. 6E, in some embodiments, a seed layer 410 is formed over the buffer layer 600a and over the exposed third conductive patterns 324a. As illustrated in FIG. 6E, the seed layer 410 is formed in a conformal manner. That is, the seed layer 410 extends into the openings $O_{316a}$ to cover the buffer layer 600a located in the openings $O_{316a}$ and to cover the exposed third conductive patterns 324a. The seed layer 410 may be formed through, for example, a sputtering process, a physical vapor deposition (PVD) process, or the like. In some embodiments, the seed layer 410 may include, for example, copper, titanium-copper alloy, or other suitable choice of materials.

Figure 6F:
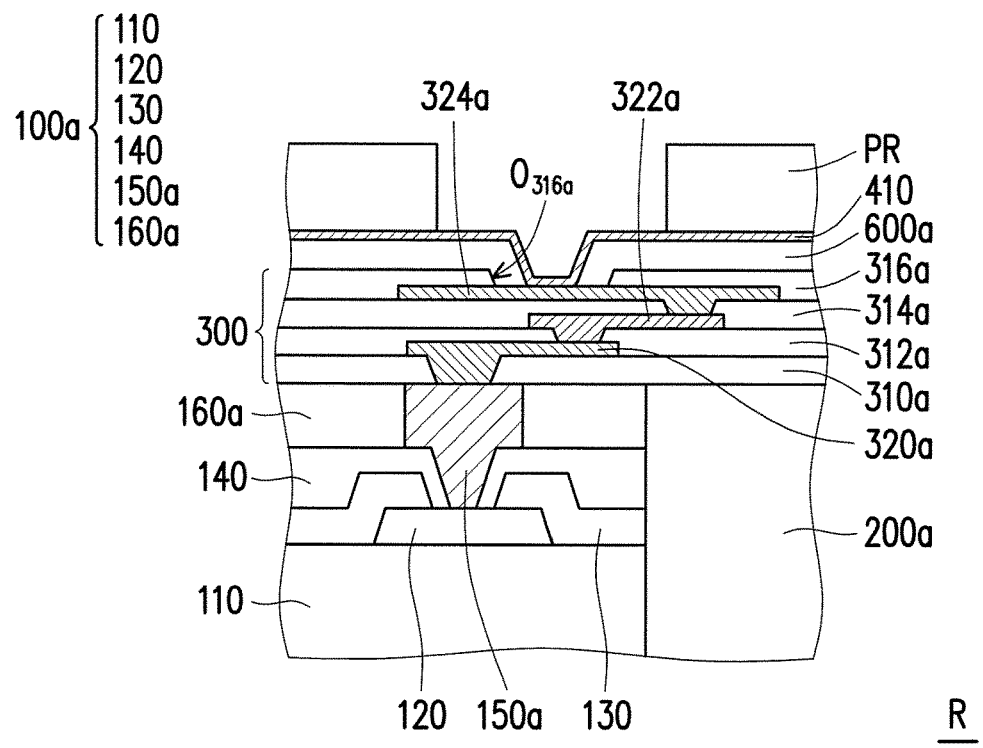

Referring to FIG. 6F, a photoresist pattern layer PR is formed over the seed layer 410. In some embodiments, the photoresist pattern layer PR exposes the seed layer 410 located in the openings $O_{316a}$. The photoresist pattern layer PR also exposes at least a portion of the seed layer 410 located on the buffer layer 600a. In some embodiments, the photoresist pattern layer PR may include photosensitive resins.

Figure 6G:
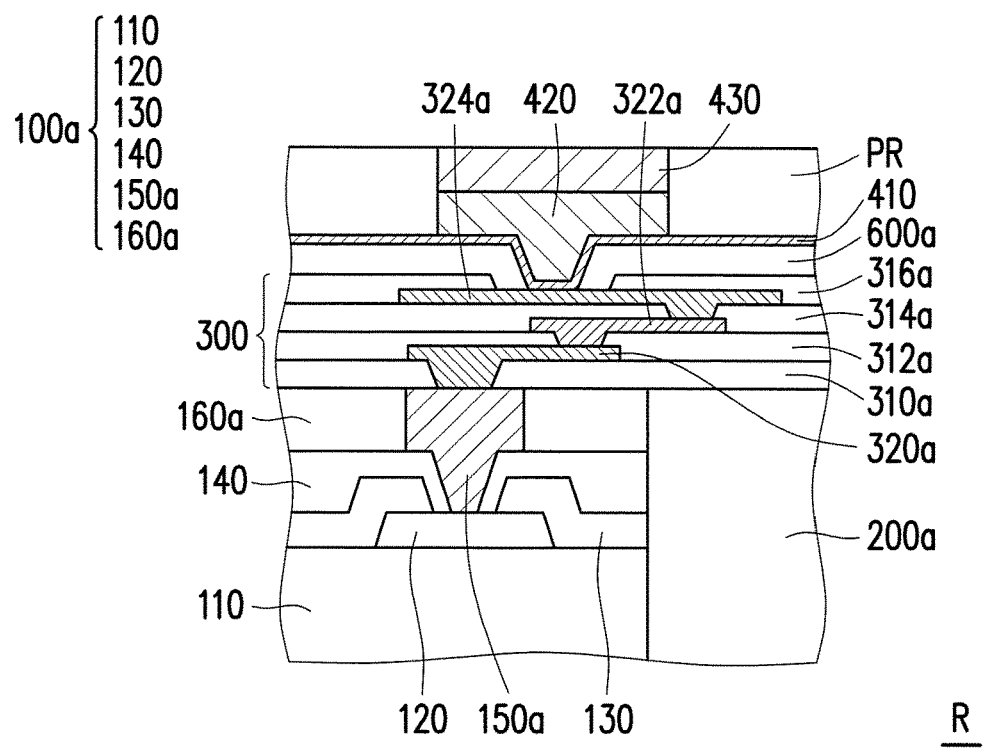

Referring to FIG. 6G, in some embodiments, conductive pillars 420 are formed on the seed layer 410 over the buffer layer 600a. In some embodiments, a conductive material (not shown) is deposited onto the exposed seed layer 410 to form the conductive pillars 420. The conductive pillars 420 are in contact with the seed layer 410 located on the third conductive patterns 324a to render electrical connection with the redistribution structure 300. Subsequently, a solder material 430 is deposited onto the conductive pillars 420. In some embodiments, the conductive material and the solder material 430 may be formed by a plating process. The plating process is, for example, electro-plating, electroless-plating, immersion plating, or the like. In some embodiments, the conductive material includes, for example, copper, copper alloys, or the like.

Figure 6H:
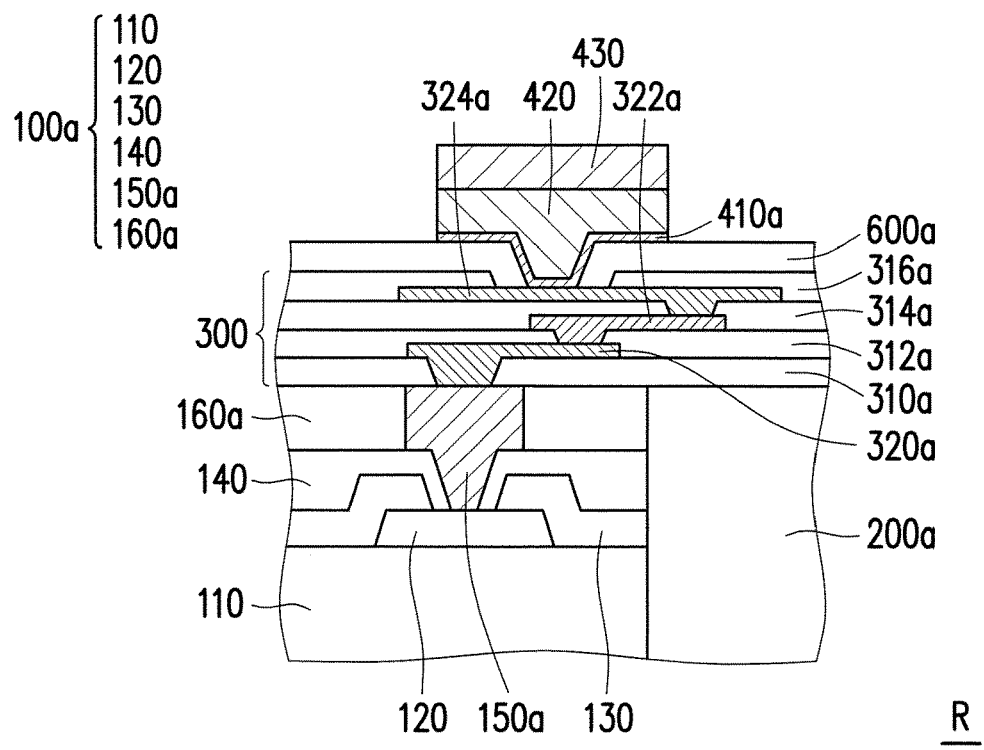
Figure 6I:
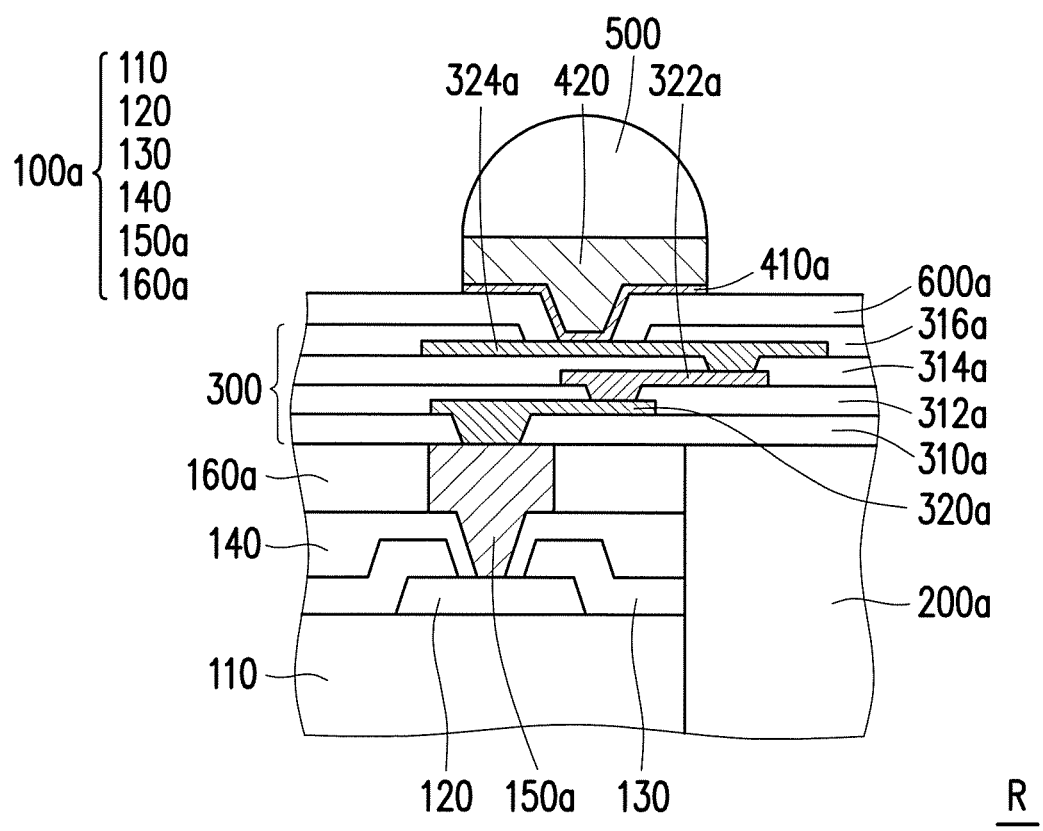

Referring to FIG. 6H, the photoresist pattern layer PR is removed and portions of the seed layer 410, which are not covered by the conductive pillars 420 and the solder material 430, are exposed. The photoresist pattern layer PR may be removed/stripped through, for example, etching, ashing, or other suitable removal processes. Subsequently, the seed layer 410 that is not covered by the conductive pillars 420 and the solder material 430 is removed to render a seed layer 410a sandwiched between the conductive pillars 420 and the buffer layer 600a and between the conductive pillars 420 and the third conductive patterns 324a. The exposed portion of the seed layer 410 may be removed through an etching process. Referring to FIG. 6I, a reflow process is performed on the solder material 430 to transform the solder material 430 into conductive bumps 500.

Figure 7A:
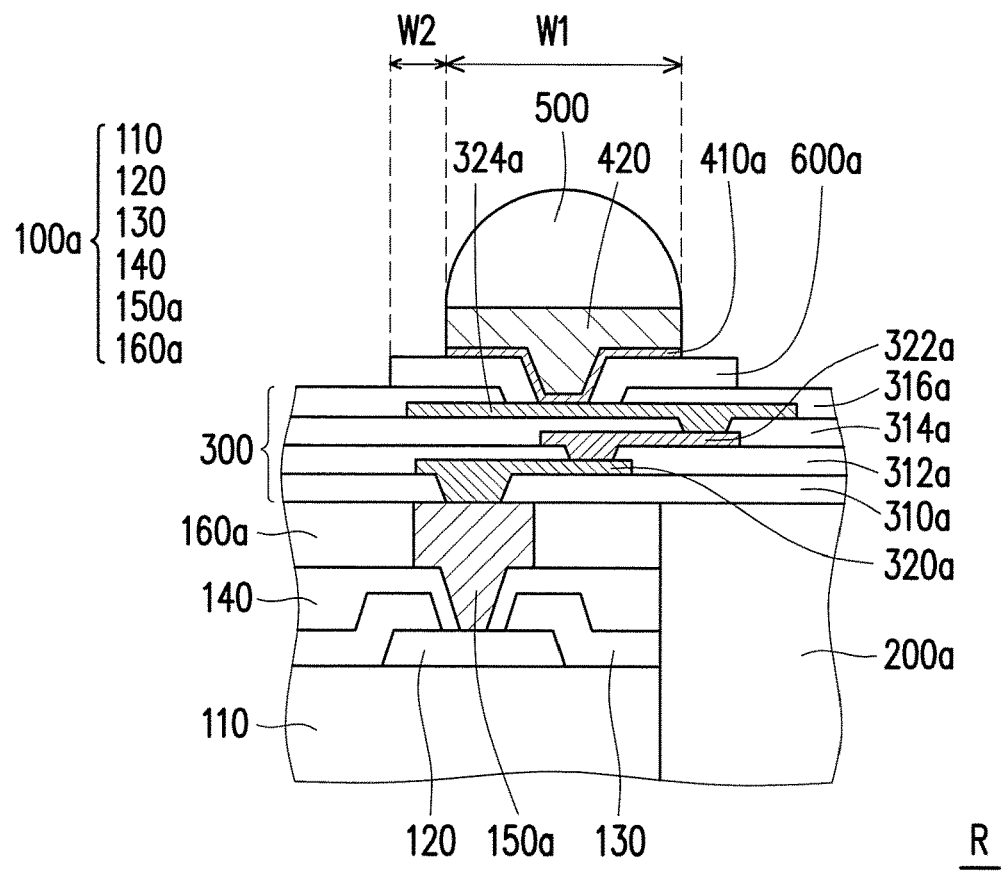
FIG. 7A is a schematic enlarged cross-sectional view illustrating an exemplary package focused in a region R in accordance with some alternative embodiments of the disclosure.
Figure 7B:
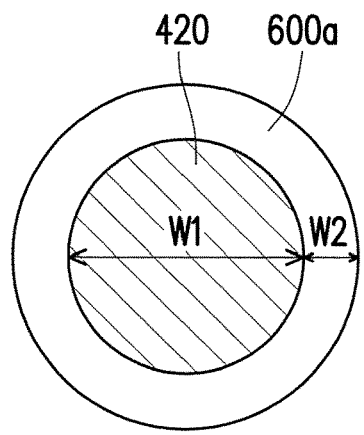
FIG. 7B is a schematic top view illustrating the buffer layer and the conductive pillar in FIG. 7A.

FIG. 7A is a schematic enlarged cross-sectional view illustrating an exemplary package focused in a region R in accordance with some alternative embodiments of the disclosure. FIG. 7B is a schematic top view illustrating a buffer layer 600a and a conductive pillar 420 in FIG. 7A. The structure illustrated in FIG. 7A is similar to the structure illustrated in FIG. 6I except for the location or coverage of the buffer layer 600a. In other words, the structure illustrated in FIG. 7A may be obtained by the processes similar to the processes illustrated in FIGS. 6A-6I, so the detailed description thereof is omitted herein. In some embodiments, an extra step of removing at least a portion of the buffer layer 600a over the fourth dielectric layer 316a may be performed to obtain a ring-shaped buffer layer 600a surrounding the conductive pillars 420. Referring to FIG. 7A and FIG. 7B, the conductive pillars 420 are depicted as round conductive pillars and the ring-shaped buffer layer 600a surrounding each conductive pillar 420 is depicted as a round ring-shaped doughnut structure as examples for illustration purposes, but are not intended to limit the scope of the disclosure. In some embodiments, each conductive pillar 420 has a maximum diameter of W1. On the other hand, an edge of the ring-shaped buffer layer 600a and a sidewall of the conductive pillar 420 has a distance of W2. In some embodiments, a ratio of W2 to W1 (W2/W1) ranges between 0.01 and 0.6. Although FIG. 7B illustrated that the conductive pillars 420 are depicted as round cylinders and the buffer layer surrounding the pillars has a corresponding shape, various shapes and different compatible shapes may be adopted, and the disclosure is not limited thereto. In some alternative embodiments, the conductive pillars 420 may be elliptical columns or even square or polygonal columns. Moreover, although FIG. 7A illustrated that the outer sidewalls of the ring-shaped buffer layer 600a are straight, the disclosure is not limited thereto. In some alternative embodiments, the outer sidewalls of the ring-shaped buffer layer 600a may be slanted to further enhance the strength of the buffer layer 600a.

Figure 8:
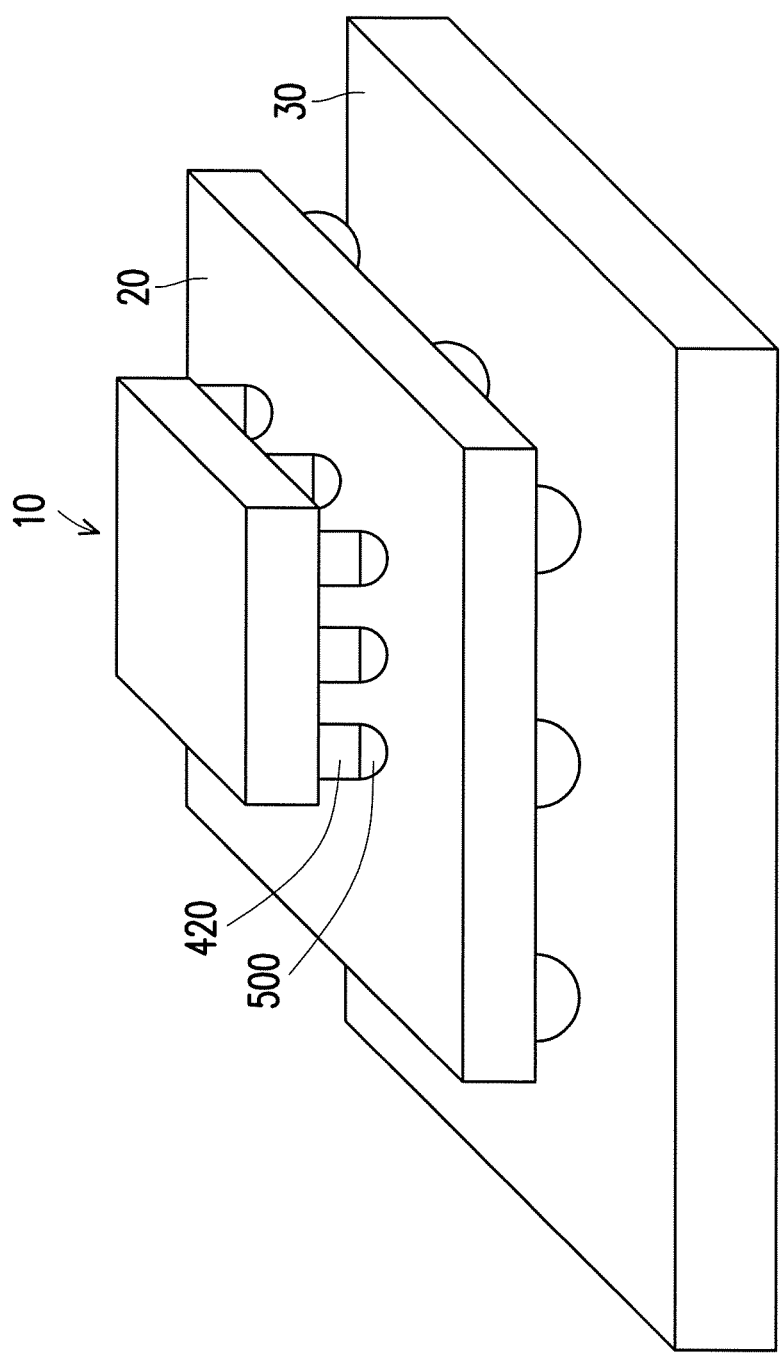
FIG. 8 is a schematic view illustrating a stacked package structure including the integrated fan-out package in FIG. 1F.

FIG. 8 is a schematic view illustrating a stacked package structurer including the integrated fan-out package 10 in FIG. 1F. Referring to FIG. 8, the integrated fan-out package 10 may be stacked on a substrate 20. In some embodiments, the substrate 20 may be a semiconductor substrate having passive devices or micro-electro-mechanical system (MEMS) devices formed thereon. In some alternative embodiments, the substrate 20 may be an interposer. The integrated fan-out package 10 may be electrically connected to the substrate 20 through the conductive pillars 420 and the conductive bumps 500. In some embodiments, the substrate 20 having the integrated fan-out package 10 thereon may be further disposed on a printed circuit board 30 to form a semiconductor device. The integrated fan-out package 10 may be electrically connected to the printed circuit board 30 through the substrate 20.

In accordance with some embodiments of the disclosure, an integrated fan-out package includes a die, an encapsulant, a redistribution structure, a plurality of conductive pillars, a seed layer, and a plurality of conductive bumps. The encapsulant encapsulates the die. The redistribution structure is over the die and the encapsulant. The redistribution structure is electrically connected to the die and includes a plurality of dielectric layers that are sequentially stacked and a plurality of conductive patterns sandwiched between the dielectric layers. A Young's modulus of the dielectric layer farthest away from the die is higher than a Young's modulus of each of the rest of the dielectric layers. The conductive patterns are electrically connected to each other. The conductive pillars are disposed on and electrically connected to the redistribution structure. The seed layer is located between the conductive pillars and the redistribution structure. The conductive bumps are disposed on the conductive pillars.

In accordance with some alternative embodiments of the disclosure, an integrated fan-out package includes a die, an encapsulant, a redistribution structure, a buffer layer, a plurality of conductive pillars, a seed layer, and a plurality of conductive bumps. The encapsulant encapsulates the die. The redistribution structure is over the die and the encapsulant. The redistribution structure is electrically connected to the die and includes a plurality of dielectric layers that are sequentially stacked and a plurality of conductive patterns sandwiched between the dielectric layers. The buffer layer is over the redistribution structure. A Young's modulus of the buffer layer is higher than a Young's modulus of each of the dielectric layers of the redistribution structure. The conductive pillars are disposed on the buffer layer and are electrically connected to the redistribution structure. The seed layer is located between the conductive pillars and the buffer layer and between the conductive pillars and the redistribution structure. The conductive bumps are disposed on the conductive pillars.

In accordance with some embodiments of the disclosure, a manufacturing method of an integrated fan-out package includes at least the following steps. A die is provided. The die is encapsulated by an encapsulant. A plurality of dielectric layers are formed over the die and the encapsulant. A plurality of conductive patterns are formed. At least part of the conductive patterns is sandwiched between the dielectric layers. The conductive patterns are electrically connected to each other. An anti-stress layer is formed over the dielectric layers. A Young's modulus of the anti-stress layer is higher than a Young's modulus of each of the dielectric layers. A plurality of conductive pillars are formed over the anti-stress layer. A plurality of conductive bumps are formed over the conductive pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
   a die;
   an encapsulant encapsulating the die;
   a redistribution structure over the die and the encapsulant, wherein the redistribution structure is electrically connected to the die and comprises:
      a plurality of dielectric layers that are sequentially stacked; and
      a plurality of conductive patterns sandwiched between the plurality of dielectric layers, wherein the dielectric layer farthest away from the die has a plurality of first openings exposing at least a portion of the conductive patterns farthest away from the die;
   a buffer layer over the redistribution structure, wherein a Young's modulus of the buffer layer is higher than a Young's modulus of each of the plurality of dielectric layers of the redistribution structure, and the buffer layer extends into the plurality of first openings to cover sidewalls of the plurality of first openings;
   a plurality of conducive pillars disposed on the buffer layer, wherein the plurality of conductive pillars are electrically connected to the redistribution structure;
   a seed layer located between the plurality of conductive pillars and the buffer layer and between the plurality of conductive pillars and the redistribution structure; and
   a plurality of conductive bumps disposed on the plurality of conductive pillars.

2. The integrated fan-out package according to claim 1, wherein the plurality of conductive pillars is in contact with the seed layer located on the conductive patterns farthest away from the die.

3. The integrated fan-out package according to claim 1, wherein the buffer layer is a ring-shaped structure surrounding the plurality of conductive pillars and exposes at least a portion of the dielectric layer farthest away from the die.

4. The integrated fan-out package according to claim 3, wherein a ratio of a distance between an edge of the buffer layer and a sidewall of the plurality of conductive pillars to a maximum diameter of the plurality conductive pillars ranges between 0.01 and 0.6.

5. The integrated fan-out package according to claim 3, wherein sidewalls of each of the plurality of conductive pillars and edges of the ring-shaped buffer layer has an offset.

6. The integrated fan-out package according to claim 3, wherein the plurality of conductive pillars partially exposes a top surface of the ring-shaped buffer layer.

7. The integrated fan-out package according to claim 1, wherein the buffer layer comprises a molding compound material.

8. The integrated fan-out package according to claim 1, wherein a ratio of the Young's modulus of each of the plurality of dielectric layers of the redistribution structure to the Young's modulus of the buffer layer ranges from 1.05 to 100.

9. A manufacturing method of an integrated fan-out package, comprising:
   providing a die;
   encapsulating the die by an encapsulant;
   forming a plurality of dielectric layers over the die and the encapsulant;
   forming a plurality of conductive patterns, wherein at least part of the plurality of conductive patterns is sandwiched between the plurality of dielectric layers, and the plurality of conductive patterns are electrically connected to each other;
   forming a first seed layer over the dielectric layer farthest away from the die and over the conductive patterns farthest away from the die;
   forming a first conductive material over the first seed layer;
   removing the first seed layer exposed by the first conductive material;
   forming an anti-stress layer around the first seed layer and the first conductive material, wherein a Young's modulus of the anti-stress layer is higher than a Young's modulus of each of the plurality of dielectric layers;
   forming a second seed layer over the first conductive material and the anti-stress layer;

forming a second conductive material over the second seed layer;

removing the second seed layer exposed by the second conductive material, wherein the first conductive material and the second conductive material form a plurality of conductive pillars; and forming a plurality of conductive bumps over the plurality of conductive pillar.

10. The method according to claim 9, wherein the step of forming the first conductive material comprises:

forming a first photoresist pattern layer over the first seed layer, wherein the first photoresist pattern layer exposes at least a portion of the first seed layer over the conductive patterns farthest away from the die;

forming the first conductive material over the first seed layer using the first photoresist pattern layer as a mask; and removing the first photoresist pattern layer.

11. The method according to claim 10, wherein the step of forming the second conductive material comprises:

forming a second photoresist pattern layer over the second seed layer, wherein the second photoresist pattern layer exposes at least a portion of the second seed layer located on the first conductive material;

forming the second conductive material over the second seed layer using the second photoresist pattern layer as a mask; and removing the second photoresist pattern layer.

12. An integrated fan-out package, comprising:

a die;

an encapsulant encapsulating the die;

a redistribution structure over the die and the encapsulant, wherein the redistribution structure is electrically connected to the die and comprises:

a plurality of dielectric layers that are sequentially stacked; and a plurality of conductive patterns sandwiched between the plurality of dielectric layers;

a buffer layer over the redistribution structure, wherein a Young's modulus of the buffer layer is higher than a Young's modulus of each of the plurality of dielectric layers of the redistribution structure;

a plurality of conducive pillars disposed on the buffer layer, wherein the plurality of conductive pillars are electrically connected to the redistribution structure;

a seed layer located between the plurality of conductive pillars and the buffer layer and between the plurality of conductive pillars and the redistribution structure, wherein the seed layer directly contacts a top surface of the dielectric layer farthest away from the die; and a plurality of conductive bumps disposed on the plurality of conductive pillars.

13. The integrated fan-out package according to claim 12, wherein the dielectric layer farthest away from the die has a plurality of first openings exposing at least a portion of the conductive patterns farthest away from the die, the buffer layer has a plurality of second openings exposing the plurality of first openings, and the plurality of second openings is larger than the plurality of first openings.

14. The integrated fan-out package according to claim 13, wherein sidewalls of the plurality of first openings and sidewalls of the plurality of second openings has an offset.

15. The integrated fan-out package according to claim 12, wherein the buffer layer is a ring-shaped structure surrounding the plurality of conductive pillars and exposes at least a portion of the dielectric layer farthest away from the die.

16. The integrated fan-out package according to claim 15, wherein a ratio of a distance between an edge of the ring-shaped buffer layer and a sidewall of the plurality of conductive pillars to a maximum diameter of the plurality conductive pillars ranges between 0.01 and 0.6.

17. The integrated fan-out package according to claim 15, wherein sidewalls of each of the plurality of conductive pillars and edges of the ring-shaped buffer layer has an offset.

18. The integrated fan-out package according to claim 15, wherein the plurality of conductive pillars partially exposes a top surface of the ring-shaped buffer layer.

19. The integrated fan-out package according to claim 12, wherein the buffer layer comprises a molding compound material.

20. The integrated fan-out package according to claim 12, wherein a ratio of the Young's modulus of each of the plurality of dielectric layers of the redistribution structure to the Young's modulus of the buffer layer ranges from 1.05 to 100.

* * * * *